US011328925B2

(12) United States Patent
Sasaki et al.

(10) Patent No.: US 11,328,925 B2
(45) Date of Patent: May 10, 2022

(54) SUBSTRATE DRYING METHOD AND SUBSTRATE PROCESSING APPARATUS

(71) Applicant: SCREEN Holdings Co., Ltd., Kyoto (JP)

(72) Inventors: Yuta Sasaki, Kyoto (JP); Hiroaki Takahashi, Kyoto (JP); Masayuki Otsuji, Kyoto (JP)

(73) Assignee: SCREEN Holdings Co., Ltd.

( * ) Notice: Subject to any disclaimer, the term of this patent is extended or adjusted under 35 U.S.C. 154(b) by 371 days.

(21) Appl. No.: 16/674,032

(22) Filed: Nov. 5, 2019

(65) Prior Publication Data

US 2020/0152447 A1 May 14, 2020

(30) Foreign Application Priority Data

Nov. 9, 2018 (JP) .............................. JP2018-211715

(51) Int. Cl.
*H01L 21/02* (2006.01)
*H01L 21/67* (2006.01)
*F26B 5/00* (2006.01)

(52) U.S. Cl.
CPC ........ *H01L 21/02101* (2013.01); *F26B 5/005* (2013.01); *H01L 21/67034* (2013.01)

(58) Field of Classification Search
CPC ......... H01L 21/02101; H01L 21/67034; F26B 5/005
USPC .......................................................... 34/351
See application file for complete search history.

(56) References Cited

U.S. PATENT DOCUMENTS

| 8,632,146 | B2* | 1/2014 | Yoshida | .................... | H04N 1/54 |
| | | | | | 347/9 |
| 9,620,353 | B2* | 4/2017 | Igarashi | .................... | B08B 3/08 |
| 9,870,914 | B2* | 1/2018 | Kagawa | ............... | H05K 999/99 |
| 10,121,646 | B2* | 11/2018 | Kagawa | ............... | H01L 21/0206 |
| 10,153,181 | B2* | 12/2018 | Sasaki | ............... | H01L 21/67028 |

(Continued)

FOREIGN PATENT DOCUMENTS

JP 2012-243869 A 12/2012
JP 2013-033817 A 2/2013

(Continued)

OTHER PUBLICATIONS

T. Sasaki et al., "Spontaneous Recurrence of Deposition and Dissolution of a Solid Layer on a Solution Surface," The Journal of Physical Chemistry, 119, pp. 9970-9974, 2015.

(Continued)

*Primary Examiner* — Stephen M Gravini
(74) *Attorney, Agent, or Firm* — Ostrolenk Faber LLP

(57) ABSTRACT

An upper surface of a substrate is supplied with a pre-drying processing liquid which is a solution of a sublimable substance and a solvent. Thereafter, the solvent is evaporated from the pre-drying processing liquid on the substrate and a solid of the sublimable substance is precipitated in the pre-drying processing liquid on the substrate. Thereafter, at least a portion of the solid of the sublimable substance is dissolved in the pre-drying processing liquid on the substrate. Thereafter, the solvent is evaporated from the pre-drying processing liquid in which the solid of the sublimable substance has been dissolved and the solid of the sublimable substance is precipitated onto the substrate. Thereafter, the solid of the sublimable substance is sublimated and removed from the upper surface of the substrate.

7 Claims, 15 Drawing Sheets

(56) References Cited

U.S. PATENT DOCUMENTS

| | | | |
|---|---|---|---|
| 11,101,147 B2 * | 8/2021 | Yoshida | H01L 21/02057 |
| 11,124,869 B2 * | 9/2021 | Sasaki | C23C 14/12 |
| 2013/0008868 A1 * | 1/2013 | Uozumi | G03F 7/405 |
| | | | 216/41 |
| 2015/0273535 A1 * | 10/2015 | Sato | H01L 21/67028 |
| | | | 134/19 |
| 2017/0040154 A1 | 9/2017 | Kagawa et al. | |
| 2020/0152447 A1 * | 5/2020 | Sasaki | F26B 5/005 |
| 2020/0357649 A1 * | 11/2020 | Kawabuchi | H01L 21/304 |
| 2021/0090910 A1 * | 3/2021 | Miya | F26B 25/003 |
| 2021/0324509 A1 * | 10/2021 | Sasaki | C23C 14/12 |
| 2021/0331192 A1 * | 10/2021 | Yoshida | H01L 21/67017 |

FOREIGN PATENT DOCUMENTS

| | | | | |
|---|---|---|---|---|
| JP | 2013-258272 A | | 12/2013 | |
| JP | 2015-050414 A | | 3/2015 | |
| JP | 2019106428 A | * | 6/2019 | B05D 1/005 |
| JP | 2020077826 A | * | 5/2020 | H01L 21/02057 |
| TW | 201719743 A | | 6/2017 | |

OTHER PUBLICATIONS

G.W. Scherer, "Factors Affecting Crystallization Pressure," International RILEM TC 186-ISA Workshop on Internal Sulfate Attack and Delayed Ettringite Formation, Sep. 4-6, 2002, Villars, Switzerland.

J. Desarnaud et al., "Drying of salt contaminated porous media: Effect of primary and secondary nucleation," Journal of Applied Physics, 118, p. 114901-1-114901-10, 2015.

* cited by examiner

FIG. 2

SUBSTRATE DRYING METHOD AND SUBSTRATE PROCESSING APPARATUS

CROSS REFERENCE TO RELATED APPLICATIONS

This application claims the benefit of priority to Japanese Patent Application No. 2018-211715 filed on Nov. 9, 2018. The entire contents of this application are hereby incorporated herein by reference.

BACKGROUND OF THE INVENTION

1. Field of the Invention

The present invention relates to a substrate drying method and a substrate processing apparatus that each dry a substrate. Examples of substrates include a semiconductor wafer, a substrate for a flat panel display (FPD) such as a liquid crystal display and an organic electroluminescence (organic EL) display, a substrate for an optical disc, a substrate for a magnetic disk, a substrate for a magneto-optical disc, a substrate for a photomask, a ceramic substrate, a substrate for a solar cell, and the like.

2. Description of Related Art

In a manufacturing process for semiconductor devices or FPDs, required processes are conducted to a substrate such as a semiconductor wafer or a glass substrate for a FPD. Such processes include supplying a substrate with a processing liquid such as a chemical liquid or a rinse liquid. After the processing liquid is supplied, the processing liquid is removed from the substrate to dry the substrate. In a single substrate processing-type substrate processing apparatus that processes substrates one by one, a spin dry is conducted to dry the substrate by rotating the substrate at high speeds and removing a liquid on the substrate.

In a case where a pattern is formed on a front surface of the substrate, when the substrate is being dried, a force due to the surface tension of the processing liquid adhering to the substrate applies to the pattern, so that the pattern may collapse. As countermeasures against this, a liquid having a lower surface tension such as IPA (isopropyl alcohol) is supplied to the substrate. Alternatively, a hydrophobizing agent is supplied to the substrate in order to bring the contact angle of the liquid to the pattern closer to 90 degrees. However, a collapsing force to collapse the pattern does not decrease to zero even when using IPA or the hydrophobizing agent. Thus, these countermeasures may not sufficiently prevent the collapse of the pattern depending on the strength of the pattern.

Recently, attention is focused on sublimation drying as a technique to prevent the collapse of the pattern. For example, JP 2012-243869 A discloses a substrate drying method and a substrate processing apparatus for sublimation drying. According to the sublimation drying disclosed in JP 2012-243869 A, a solution of a sublimable substance is supplied to the upper surface of a substrate to replace DIW on the substrate with the solution of the sublimable substance. Thereafter, the solvent for the sublimable substance is evaporated to precipitate the sublimable substance. This forms a film consisting of the solid sublimable substance on the upper surface of the substrate. Thereafter, the substrate is heated. This causes the sublimable substance on the substrate to be sublimated and thus removed from the substrate.

In general, the sublimation drying provides lower collapse rates of patterns as compared with conventional drying methods such as the spin dry to remove a liquid by rotating the substrate at high speeds or the IPA drying that uses IPA. However, if the pattern is extremely low in strength, even when the sublimation drying is performed, the pattern collapse may not sufficiently be prevented in some cases.

SUMMARY OF THE INVENTION

A preferred embodiment of the present invention provides a substrate drying method including a pre-drying processing liquid supplying step of supplying an upper surface of a substrate, on which a pattern is formed, with a pre-drying processing liquid which is a solution including a sublimable substance corresponding to a solute and a solvent in which the sublimable substance dissolved, and forming a liquid film of the pre-drying processing liquid onto the upper surface of the substrate, a first precipitation step of precipitating a solid of the sublimable substance in the pre-drying processing liquid on the upper surface of the substrate by evaporating the solvent from the pre-drying processing liquid on the upper surface of the substrate, a first dissolving step of dissolving at least a portion of the solid of the sublimable substance in the pre-drying processing liquid on the upper surface of the substrate, a final precipitation step of precipitating the solid of the sublimable substance onto the upper surface of the substrate by evaporating the solvent from the pre-drying processing liquid in which the solid of the sublimable substance has been dissolved, and a sublimating step of removing the solid of the sublimable substance from the upper surface of the substrate by sublimating the solid of the sublimable substance.

According to this method, the solution including the sublimable substance and the solvent and corresponding to the pre-drying processing liquid is supplied to the upper surface of the substrate. Thus, the liquid film of the pre-drying processing liquid is formed on the upper surface of the substrate. Thereafter, the solvent is evaporated from the pre-drying processing liquid. The concentration of the sublimable substance in the pre-drying processing liquid increases in accordance with the vaporization of the solvent. When the concentration of the sublimable substance reaches the saturating concentration of the sublimable substance, the solid of the sublimable substance precipitates in the pre-drying processing liquid.

When the precipitation of the solid of the sublimable substance has started, the pre-drying processing liquid remains on the upper surface of the substrate. At least a portion of the solid of the sublimable substance is dissolved in the remaining pre-drying processing liquid. Thereafter, the solvent is evaporated from the pre-drying processing liquid again. Thus, the contained amount of the solvent decreases, and then the solid of the sublimable substance precipitates onto the upper surface of the substrate. Thereafter, the solid of the sublimable substance is sublimated and removed from the substrate. In this way, the pre-drying processing liquid is removed from the substrate and the substrate is dried.

Before the solid of the sublimable substance is precipitated first, the pre-drying processing liquid exists not only between patterns but also above the patterns. For the substrate such as a semiconductor wafer or a glass substrate for FPD, the gap between the patterns is narrow. In a case where the gap between the patterns is narrow, the pre-drying processing liquid between the patterns may have a property different from that of a bulk of the pre-drying processing liquid, that is, the pre-drying processing liquid existing in a range from the surface (upper surface) of the pre-drying processing liquid to the upper surfaces of the patterns. The differences in properties between the two become large as the gap between the patterns decrease.

If the gap between the patterns is narrow, when the solid of the sublimable substance precipitates first, there is a case where the solid of the sublimable substance precipitates only in the bulk of the pre-drying processing liquid and an incomplete precipitation region in which no or almost no solid of the sublimable substance exists between the patterns is formed in the upper surface of the substrate. In this case, the surface tension of the pre-drying processing liquid between the patterns applies to the side surfaces of the patterns, so that the patterns in the incomplete precipitation region could collapse while the solid of the sublimable substance sublimates. This causes an increase (worsening) in the collapse rate of the patterns.

In contrast, it has been found that crystal cores of the solid of the sublimable substance are formed in a narrow space such as a space between the patterns when the precipitated solid of the sublimable substance is dissolved in the pre-drying processing liquid and then the solid of the sublimable substance is precipitated again. Thus, if the gap between the patterns is narrow, it is possible to prevent the incomplete precipitation region from generating or to reduce the area of the incomplete precipitation region by dissolving the precipitated solid of the sublimable substance into the pre-drying processing liquid and thereafter precipitating the solid of the sublimable substance again. Accordingly, it is possible to decrease the collapse of the pattern and the collapse rate of the patterns.

In the preferred embodiment, at least one of the following features may be added to the substrate drying method.

The first precipitation step includes a room temperature precipitation step of precipitating the solid of the sublimable substance onto the upper surface of the substrate by evaporating the solvent from the pre-drying processing liquid on the upper surface of the substrate while keeping a temperature of the pre-drying processing liquid on the upper surface of the substrate lower than or equal to a room temperature.

According to this method, the solvent is evaporated from the pre-drying processing liquid while keeping the pre-drying processing liquid on the substrate W at or below the room temperature without heating the pre-drying processing liquid. In this case, the concentration of the sublimable substance locally increases at the surface of the pre-drying processing liquid and the solid of the sublimable substance precipitates at the surface of the pre-drying processing liquid or its vicinity. At the same time, the pre-drying processing liquid remains between the solid of the sublimable substance and the upper surface of the pattern. The solid of the sublimable substance dissolves in the remaining pre-drying processing liquid.

In contrast, when the solvent is evaporated from the pre-drying processing liquid by heating the pre-drying processing liquid, the temperature of the pre-drying processing liquid rises to a value higher than the room temperature and the concentration of the sublimable substance in the pre-drying processing liquid also rises. When the solid of the sublimable substance is precipitated by natural cooling or forced cooling of the pre-drying processing liquid after the concentration of the sublimable substance rises, there is a case where the most portion or the entirety of the bulk of the pre-drying processing liquid changes to the solid of the sublimable substance.

When the pre-drying processing liquid does not exist above the patterns, the solid of the sublimable substance does not effectively dissolve in the pre-drying processing liquid. Even when the pre-drying processing liquid exists between the patterns, the efficiency of dissolving the solid of the sublimable substance into the pre-drying processing liquid existing between the patterns is inferior to the efficiency of dissolving the solid of the sublimable substance into the bulk of the pre-drying processing liquid. Thus, it is possible to effectively dissolve the solid of the sublimable substance into the pre-drying processing liquid by maintaining some of the bulk of the pre-drying processing liquid in liquid.

The first dissolving step includes a heating step of heating the pre-drying processing liquid on the upper surface of the substrate at a heating temperature higher than a room temperature.

According to this method, the pre-drying processing liquid on the upper surface of the substrate is heated and the temperature of the pre-drying processing liquid rises to a value higher than the room temperature. The dissolution of the solid of the sublimable substance in the pre-drying processing liquid is urged by increasing the temperature of the pre-drying processing liquid. Thus, it is possible to effectively dissolve the solid of the sublimable substance into the pre-drying processing liquid. Furthermore, a forced dissolution of the solid of the sublimable substance is started in accordance with the start of heating, so that it is possible to start the forced dissolution of the solid of the sublimable substance at any time by changing the timing to start of heating.

The heating step includes an indirectly heating step of heating the pre-drying processing liquid on the upper surface of the substrate at the heating temperature by heating the substrate from below the substrate.

According to this method, the solid of the sublimable substance and the pre-drying processing liquid are not directly heated from above the substrate, but are indirectly heated via the substrate. When the solid of the sublimable substance and the pre-drying processing liquid are heated from above the substrate, a portion of the solid of the sublimable substance existing on the surface of the pre-drying processing liquid may sublimate. In this case, a portion of the solid of the sublimable substance is wasted and the final thickness of the solid of the sublimable substance is smaller than the intended value. It is possible to reduce such a loss of the sublimable substance by heating the solid of the sublimable substance and the pre-drying processing liquid via the substrate.

The final precipitation step includes a step of precipitating the solid of the sublimable substance onto the upper surface of the substrate by evaporating the solvent from the pre-drying processing liquid on the upper surface of the substrate while heating the pre-drying processing liquid on the upper surface of the substrate at the heating temperature.

According to this method, the solvent is evaporated from the pre-drying processing liquid while heating the pre-drying processing liquid so as to precipitate the solid of the sublimable substance onto the substrate. Thus, the solid of the sublimable substance precipitates from the hot pre-drying processing liquid. The saturating concentration of the sublimable substance in the pre-drying processing liquid rises as the temperature of the pre-drying processing liquid rises. The proportion of the solvent included in the solid of the sublimable substance decreases as the saturating concentration of the sublimable substance rises. When the solid of the sublimable substance sublimates, the solvent included in the solid of the sublimable substance could generate a collapsing force to collapse the pattern. Accordingly, it is possible to further decrease the collapse rate of the patterns by decreasing the contained amount of the solvent.

The first precipitation step includes a liquid surface precipitation step of precipitating the solid of the sublimable substance onto a surface of the pre-drying processing liquid on the upper surface of the substrate by evaporating the solvent from the pre-drying processing liquid on the upper surface of the substrate, the first dissolving step includes a spontaneously dissolving step of allowing at least a portion of the solid of the sublimable substance to dissolve in or be dissolved in the pre-drying processing liquid on the upper surface of the substrate by allowing the temperature of the pre-drying processing liquid to increase or be increased due to heat of an atmosphere in contact with the solid of the sublimable substance.

According to this method, the solid of the sublimable substance is precipitated onto the surface of the pre-drying processing liquid. When the solvent evaporates from the pre-drying processing liquid, the heat of the pre-drying processing liquid, which corresponds to the heat of vaporization, is released into the atmosphere together with the solvent and the temperature of the surface of the pre-drying processing liquid decreases. When the solid of the sublimable substance is formed, the solvent to evaporate from the pre-drying processing liquid decreases, so that the heat of the pre-drying processing liquid to be released into the atmosphere also decreases. At the same time, the heat in the atmosphere is transmitted to the pre-drying processing liquid via the solid of the sublimable substance. Thus, temperature of the interface between the solid of the sublimable substance and the pre-drying processing liquid increases. Accordingly, it is possible to dissolve the solid of the sublimable substance into the pre-drying processing liquid without forcibly heating the pre-drying processing liquid on the substrate.

Another preferred embodiment of the present invention provides a substrate processing apparatus including a pre-drying processing liquid supplying unit that supplies an upper surface of a substrate, on which a pattern is formed, with a pre-drying processing liquid which is a solution including a sublimable substance corresponding to a solute and a solvent in which the sublimable substance dissolved, and forms a liquid film of the pre-drying processing liquid onto the upper surface of the substrate, a first precipitation unit that precipitates a solid of the sublimable substance in the pre-drying processing liquid on the upper surface of the substrate by evaporating the solvent from the pre-drying processing liquid on the upper surface of the substrate, a first dissolving unit that dissolves at least a portion of the solid of the sublimable substance in the pre-drying processing liquid on the upper surface of the substrate, a final precipitation unit that precipitates the solid of the sublimable substance onto the upper surface of the substrate by evaporating the solvent from the pre-drying processing liquid in which the solid of the sublimable substance has been dissolved, and a sublimating unit that removes the solid of the sublimable substance from the upper surface of the substrate by sublimating the solid of the sublimable substance. According to this arrangement, the same effects as those of the substrate drying method described above can be obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is schematic view showing the inside of a processing unit, when viewed horizontally, which is provided in the substrate processing apparatus.

DETAILED DESCRIPTION OF PREFERRED EMBODIMENTS

In the descriptions below, unless otherwise specified, it is to be understood that the atmospheric pressure inside a substrate processing apparatus 1 is kept at atmospheric pressure inside a clean room in which the substrate processing apparatus 1 is installed (e.g., one atmospheric pressure or a value in its vicinity).

Figure 1A:
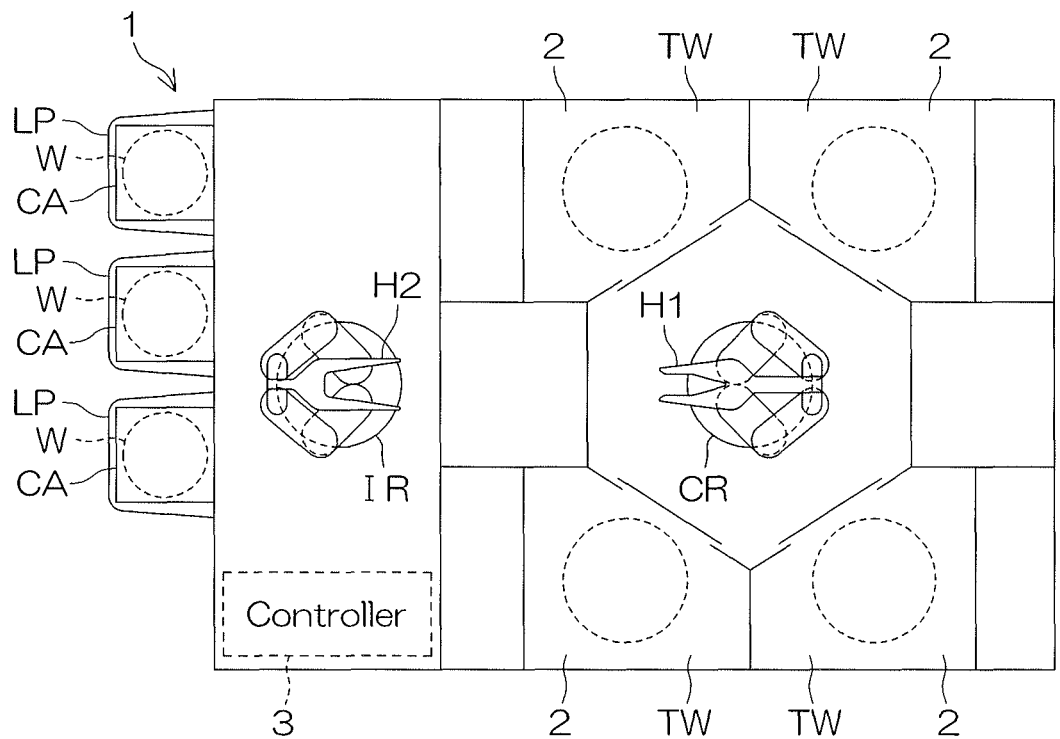
FIG. 1A is a schematic view of a substrate processing apparatus according to a preferred embodiment of the present invention when viewed from above.
Figure 1B:
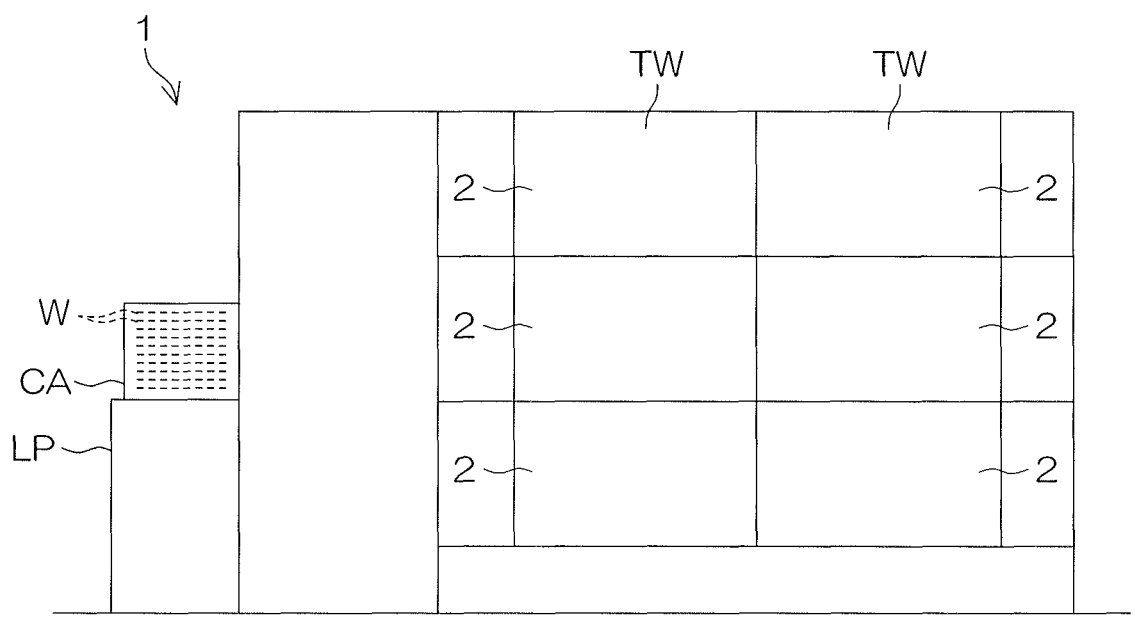
FIG. 1B is a schematic view of the substrate processing apparatus when viewed from the side.

FIG. 1A is a schematic view of a substrate processing apparatus 1 according to a preferred embodiment of the present invention when viewed from above. FIG. 1B is a schematic view of the substrate processing apparatus 1 when viewed from the side.

As shown in FIG. 1A, the substrate processing apparatus 1 is a single substrate processing-type apparatus that processes disc-shaped substrates W such as a semiconductor wafer one by one. The substrate processing apparatus 1 includes load ports LP that hold carriers CA that house one or more substrates W, a plurality of processing units 2 that process the substrates W transferred from the carriers CA on the load ports LP with a processing fluid such as a processing liquid or a processing gas, transfer robots that transfer the substrates W between the carriers CA on the load ports LP and the processing units 2 and a controller 3 that controls the substrate processing apparatus 1.

The transfer robots include an indexer robot IR that carries the substrates W into and out from the carriers CA on the load ports LP and a center robot CR that carries the substrates W into and out from the processing units 2. The indexer robot IR transfers the substrates W between the load ports LP and the center robot CR, the center robot CR transfers the substrates W between the indexer robot IR and the processing units 2. The center robot CR includes hands H1 that support the substrates W and the indexer robot IR includes hands H2 that support the substrates W.

The plurality of processing units 2 form a plurality of towers TW disposed around the center robot CR in a plan view. FIG. 1A shows an example in which four towers TW are formed. The center robot CR is able to access each of the towers TW. As shown in FIG. 1B, each of the towers TW includes the plurality of (for example, three) processing units 2 that are stacked vertically.

Figure 2:
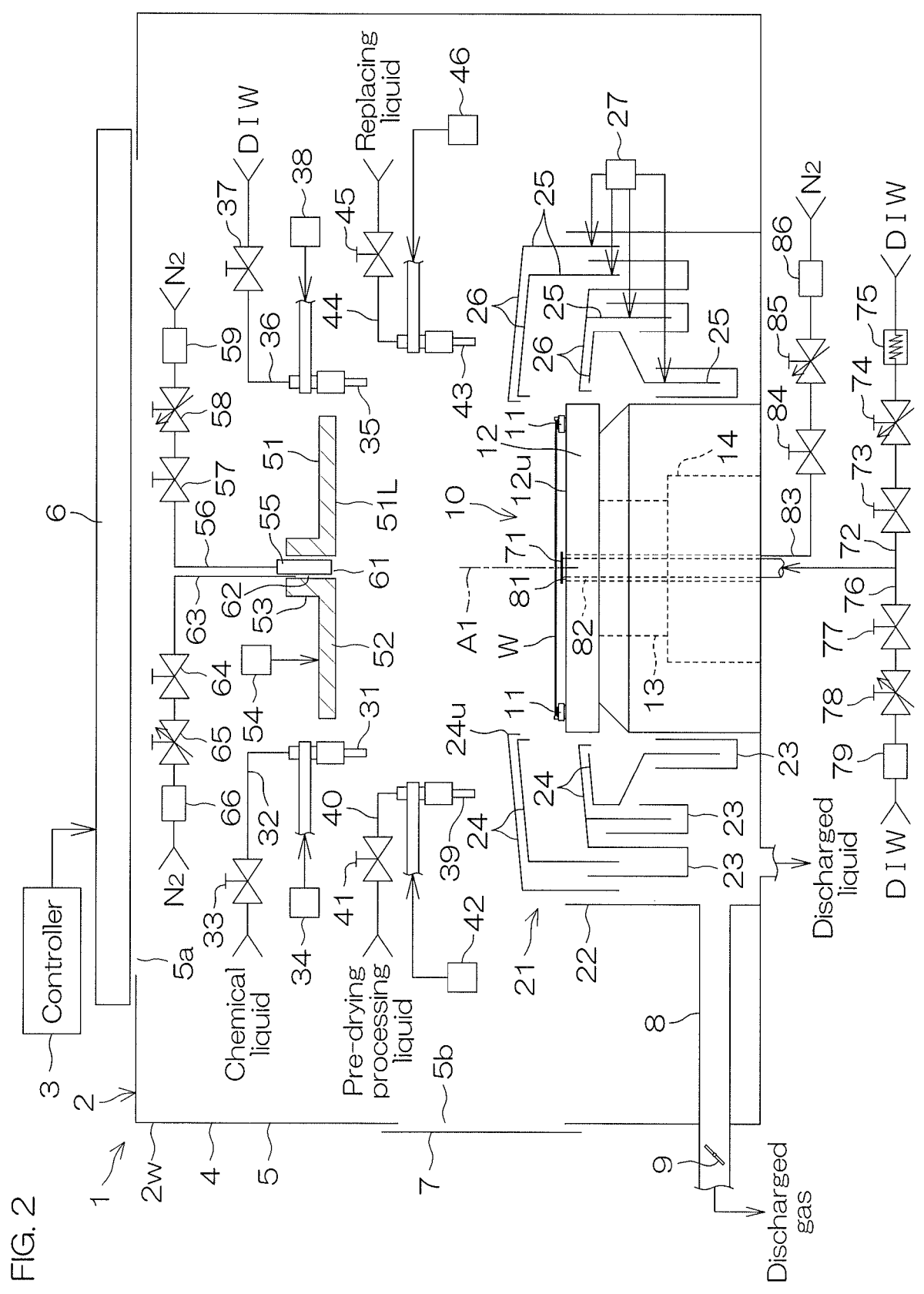

FIG. 2 is schematic view showing the inside of a processing unit 2, when viewed horizontally, which is provided in the substrate processing apparatus 1.

The processing unit 2 is a wet-processing unit 2W that provides the processing liquid to the substrate W. The processing unit 2 includes a box-shaped chamber 4 that has an internal space, a spin chuck 10 that rotates one substrate W around a vertical rotation axis A1 passing through the central portion of the substrate W while holding the substrate W horizontally within the chamber 4 and a tubular processing cup 21 that surrounds the spin chuck 10 around the rotation axis A1.

The chamber 4 includes a box-shaped partition wall 5 provided with a carry-in/carry-out port 5b through which the substrate W passes, and a shutter 7 to open and close the carry-in/carry-out port 5b. An FFU 6 (fan filter unit) is disposed on an air outlet 5a that is provided in the upper portion of the partition wall 5. The FFU 6 supplies clean air (filtered air) all the time through the air outlet 5a into the chamber 4. A gas inside the chamber 4 is discharged from the chamber 4 through an exhaust duct 8 that is connected to the bottom portion of the processing cup 21. Thus, the downflow of clean air is formed inside the chamber 4 all the time. The flow rate of the discharged gas that is discharged into the exhaust duct 8 changes depending on the opening degree of an exhaust valve 9 that is disposed inside the exhaust duct 8.

The spin chuck 10 includes a disc-shaped spin base 12 that is held in a horizontal posture, a plurality of chuck pins 11 that hold the substrate W in the horizontal posture above the spin base 12, a spin shaft 13 that extends downward from the central portion of the spin base 12 and a spin motor 14 that rotates the spin base 12 and the chuck pins 11 by rotating the spin shaft 13. The spin chuck 10 is not limited to a clamping type chuck that brings the chuck pins 11 into contact with the outer circumferential surface of the substrate W, and the spin chuck 10 may be a vacuum-type chuck that sucks the rear surface (lower surface) of the substrate W that is a non-device formation surface to the upper surface 12u of the spin base 12 so as to hold the substrate W horizontally.

The processing cup 21 includes a plurality of guards 24 to receive a processing liquid discharged outwardly from the substrate W, a plurality of cups 23 to receive the processing liquid guided downwardly by the plurality of guards 24, and a cylindrical outer wall member that surrounds the plurality of guards 24 and the plurality of cups 23. FIG. 2 shows an example in which four guards 24 and three cups 23 are provided, and the outermost cup 23 is integral with the guard 24 that is the third from the top.

The guard 24 includes a cylindrical portion 25 that surrounds the spin chuck 10, and an annular ceiling portion 26 that extends diagonally upwardly toward the rotation axis A1 from the upper end portion of the cylindrical portion 25. The plurality of ceiling portions 26 are stacked in the vertical direction, and the plurality of cylindrical portions 25 are disposed concentrically. The annular upper end of the ceiling portions 26 corresponds to the upper end 24u of the guards 24 that surround the substrate W and the spin base 12 in a plan view. The plurality of cups 23 are disposed below the plurality of cylindrical portions 25, respectively. The cup 23 defines an annular liquid-receiving groove that receives a processing liquid guided downwardly by the guard 24.

The processing unit 2 includes a guard elevating/lowering unit 27 to individually elevate and lower the plurality of guards 24. The guard elevating/lowering unit 27 locates the guards 24 at an arbitrary position from an upper position to a lower position. FIG. 2 shows a state in which two guards 24 are disposed at an upper position, and the remaining two guards 24 are disposed at a lower position. The upper position is a position in which the upper end 24u of the guards 24 is disposed higher than a holding position in which the substrate W held by the spin chuck 10 is disposed. The lower position is a position in which the upper end 24u of the guards 24 is disposed lower than the holding position.

A processing liquid is supplied to the rotating substrate W in a state in which at least one guard 24 is disposed at the upper position. When the processing liquid is supplied to the substrate W in the state, the processing liquid supplied to the substrate W flies off around the substrate W. The flied-off processing liquid collides with the inner surface of the guard 24 horizontally opposing the substrate W, and is then guided with the cup 23 that is associated with the guard 24. This allows the processing liquid discharged from the substrate W to be collected in the processing cup 21.

The processing unit 2 includes a plurality of nozzles to discharge the processing liquid to the substrate W held by the spin chuck 10. The plurality of nozzles include a chemical liquid nozzle 31 to discharge a chemical liquid to the upper surface of the substrate W, a rinse liquid nozzle 35 to discharge a rinse liquid to the upper surface of the substrate W, a pre-drying processing liquid nozzle 39 to discharge the pre-drying processing liquid to the upper surface of the substrate W, and a replacing liquid nozzle 43 to discharge a replacement liquid to the upper surface of the substrate W.

The chemical liquid nozzle 31 may be a scan nozzle that is horizontally movable within the chamber 4 or alternatively, may be a fixed nozzle that is secured with respect to the partition wall 5 of the chamber 4. The same applies to the rinse liquid nozzle 35, the pre-drying processing liquid nozzle 39, and the replacing liquid nozzle 43. FIG. 2 shows an example in which each of the chemical liquid nozzle 31, the rinse liquid nozzle 35, the pre-drying processing liquid nozzle 39, and the replacing liquid nozzle 43 is a scan nozzle, and four nozzle moving units associated with those four nozzles respectively are provided.

The chemical liquid nozzle 31 is connected to a chemical liquid piping 32 that guides a chemical liquid to the chemical liquid nozzle 31. When a chemical liquid valve 33 interposed in the chemical liquid piping 32 is opened, the chemical liquid is continuously discharged downwardly from the discharge port of the chemical liquid nozzle 31. The chemical liquid to be discharged from the chemical liquid nozzle 31 may be a liquid that contains at least one of sulfuric acid, nitric acid, hydrochloric acid, hydrofluoric acid, phosphorus acid, acetic acid, ammonia water, a hydrogen peroxide solution, organic acid (e.g., such as citric acid or oxalic acid), organic alkaline (e.g., TMAH: tetramethyl ammonium hydroxide), a surface-active agent, and a corrosion inhibitor, or alternatively, may be a solution other than those.

Although not shown, the chemical liquid valve 33 includes a valve body provided with an annular valve seat through which the chemical liquid passes, a valve member which is movable with respect to the valve seat and an actuator which moves the valve member between a closed position where the valve member is in contact with the valve seat and an open position where the valve member is separated from the valve seat. The same applies to other valves. The actuator may be a pneumatic actuator or an electric actuator or an actuator other than those. The controller 3 opens and closes the chemical liquid valve 33 by controlling the actuator.

The chemical liquid nozzle 31 is connected to a nozzle moving unit 34 that moves the chemical liquid nozzle at least in one of the vertical and horizontal directions. The nozzle moving unit 34 horizontally moves the chemical liquid nozzle 31 between a processing position at which the chemical liquid discharged from the chemical liquid nozzle 31 is supplied to the upper surface of the substrate W and a standby position at which the chemical liquid nozzle 31 is positioned around the processing cup 21 in a plan view.

The rinse liquid nozzle 35 is connected to a rinse liquid piping 36 that guides a rinse liquid to the rinse liquid nozzle 35. When a rinse liquid valve 37 interposed in the rinse liquid piping 36 is opened, the rinse liquid is continuously discharged downwardly from the discharge port of the rinse liquid nozzle 35. For example, the rinse liquid discharged from the rinse liquid nozzle 35 is pure water (DIW (Deionized Water)). The rinse liquid may be any one of carbonated water, electrolyzed ion water, hydrogen water, ozone water, and hydrochloric acid water of a diluted concentration (e.g., approximately 10 to 100 ppm).

The rinse liquid nozzle 35 is connected to a nozzle moving unit 38 that moves the rinse liquid nozzle 35 at least in one of the vertical and horizontal directions. The nozzle moving unit 38 horizontally moves the rinse liquid nozzle 35 between the processing position, at which the rinse liquid discharged from the rinse liquid nozzle 35 is supplied to the upper surface of the substrate W, and the standby position at which the rinse liquid nozzle 35 is located around the processing cup 21 in a plan view.

The pre-drying processing liquid nozzle 39 is connected to a pre-drying processing liquid piping 40 that guides the processing liquid to the pre-drying processing liquid nozzle 39. When a pre-drying processing liquid valve 41 interposed in the pre-drying processing liquid piping 40 is opened, the pre-drying processing liquid is continuously discharged downwardly from the discharge port of the pre-drying processing liquid nozzle 39. Similarly, the replacing liquid nozzle 43 is connected to a replacing liquid piping 44 that guides a replacement liquid to the replacing liquid nozzle 43. When a replacing liquid valve 45 interposed in the replacing liquid piping 44 is opened, the replacement liquid is continuously discharged downwardly from the discharge port of the replacing liquid nozzle 43.

The pre-drying processing liquid is a solution that contains a sublimable substance corresponding to a solute, and a solvent in which the sublimable substance dissolves. The sublimable substance may be a substance that changes from solid to gas without passing through to a liquid at normal temperature (the same as the room temperature) or at normal pressure (the pressure inside the substrate processing apparatus 1, e.g., at one atmospheric pressure or a value in its vicinity).

The freezing point of the pre-drying processing liquid (the freezing point at one atmospheric pressure; the same applies hereinafter) is lower than the room temperature (23° C. or a value in its vicinity). The substrate processing apparatus 1 is disposed inside a clean room that is maintained at the room temperature. Therefore, even without heating the pre-drying processing liquid, the pre-drying processing liquid can be maintained in the form of liquid. The freezing point of the sublimable substance is higher than the freezing point of the pre-drying processing liquid. The freezing point of the sublimable substance is higher than the room temperature. The sublimable substance is solid at the room temperature. The freezing point of the sublimable substance may be higher than the boiling point of the solvent. The vapor pressure of the solvent is higher than the vapor pressure of the sublimable substance.

For example, the sublimable substance may be any one of alcohol (for example, 2-methyl-2-propanol (alias: tert-butyl alcohol, t-butyl alcohol) or cyclohexanol), a fluorinated hydrocarbon compound, 1,3,5-trioxane (alias: metaformaldehyde), camphor, naphthalene and iodine, or alternatively, may be a substance other than those.

For example, the solvent may be at least one type selected from the group consisting of pure water, IPA, methanol, HFE (hydrofluoroether), acetone, PGMEA (propylene glycol monomethyl ether acetate), PGEE (propylene glycol monoethyl ether, 1-ethoxy-2-propanol), and ethylene glycol.

Now, description will be made below for an example in which the sublimable substance is camphor, and the solvent is IPA or methanol.

The freezing point of camphor is 175 to 177° C. Even if the solvent is any one of IPA and methanol, the freezing point of camphor is higher than the freezing point of solvent. The vapor pressure of IPA is higher than the vapor pressure of camphor. Similarly, the vapor pressure of methanol is higher than the vapor pressure of camphor. Thus, IPA and methanol are easier to evaporate than camphor. IPA has a higher vapor pressure than water and a lower surface tension than water. Similarly, methanol has a higher vapor pressure than water and a lower surface tension than water. Each of IPA and methanol has a lower molecular weight than water. Methanol has a lower molecular weight than IPA.

As described below, the replacement liquid is supplied to the upper surface of the substrate W covered with the liquid film of the rinse liquid, and the pre-drying processing liquid is supplied to the upper surface of the substrate W covered with the liquid film of the replacement liquid. The replacement liquid may be any liquid as long as the replacement liquid dissolves in both the rinse liquid and the pre-drying processing liquid. The replacement liquid is IPA (liquid), for example. The replacement liquid may be a liquid mixture of IPA and HFE, or may be a liquid other than these. The replacement liquid may be a liquid having the same name as that of the component of the pre-drying processing liquid such as the solvent, or may be a liquid having a name different from those of any components of the pre-drying processing liquid.

When the replacement liquid is supplied to the upper surface of the substrate W covered with the liquid film of rinse liquid, most of the rinse liquid on the substrate W is washed away by the replacement liquid and thus discharged from the substrate W. The small amount of remaining rinse liquid is dissolved in the replacement liquid to be diffused into the replacement liquid. The diffused rinse liquid is discharged from the substrate W together with the replacement liquid. Therefore, the rinse liquid on the substrate W can be efficiently replaced with the replacement liquid. For the same reason, the replacement liquid on the substrate W can be efficiently replaced with the pre-drying processing liquid. This makes it possible to reduce the rinse liquid contained in the pre-drying processing liquid on the substrate W.

The pre-drying processing liquid nozzle 39 is connected to a nozzle moving unit 42 that moves the pre-drying processing liquid nozzle 39 at least in one of the vertical and horizontal directions. The nozzle moving unit 42 horizontally moves the pre-drying processing liquid nozzle 39 between the processing position, at which the pre-drying processing liquid discharged from the pre-drying processing liquid nozzle 39 is supplied to the upper surface of the substrate W, and the standby position at which the pre-drying processing liquid nozzle 39 is located around the processing cup 21 in a plan view.

Similarly, the replacing liquid nozzle 43 is connected to a nozzle moving unit 46 that moves the replacing liquid nozzle 43 at least in one of the vertical and horizontal directions. The nozzle moving unit 46 horizontally moves the replacing liquid nozzle 43 between the processing position, at which the replacement liquid discharged from the replacing liquid nozzle 43 is supplied to the upper surface of the substrate W, and the standby position at which the replacing liquid nozzle 43 is located around the processing cup 21 in a plan view.

The processing unit 2 includes a shielding member 51 that is disposed above the spin chuck 10. FIG. 2 shows an example in which the shielding member 51 is a disc-shaped shielding plate. The shielding member 51 includes a disc portion 52 that is horizontally disposed above the spin chuck 10. The shielding member 51 is horizontally supported by a tubular support shaft 53 that extends upwardly from the center portion of the disc portion 52. The center line of the disc portion 52 is disposed on the rotation axis A1 of the substrate W. The lower surface of the disc portion 52 corresponds to the lower surface 51L of the shielding member 51. The lower surface 51L of the shielding member 51 is an opposing surface that faces the upper surface of the substrate W. The lower surface 51L of shielding member 51 is parallel to the upper surface of the substrate W, and has an outer diameter that is greater than or equal to the diameter of the substrate W.

The shielding member 51 is connected to a shielding member elevating/lowering unit 54 that vertically elevates or lowers the shielding member 51. The shielding member elevating/lowering unit 54 locates the shielding member 51 at an arbitrary position from the upper position (the position shown in FIG. 2) to the lower position. The lower position is the proximity position at which the shielding member 51 is located at a height in which the lower surface 51L of the shielding member 51 comes into proximity to the upper surface of the substrate W and a scan nozzle such as the chemical liquid nozzle 31 cannot enter between the substrate W and the shielding member 51. The upper position is the separate position at which the shielding member 51 retracts to a height in which the scan nozzle is able to enter between the shielding member 51 and the substrate W.

The plurality of nozzles include a central nozzle 55 that downwardly discharges a processing fluid such as a processing liquid or a processing gas through an upper central opening 61 that is opened at the center portion of the lower surface 51L of the shielding member 51. The central nozzle 55 extends vertically along the rotation axis A1. The central nozzle 55 is disposed inside a through-hole that vertically penetrates the center portion of the shielding member 51. The inner circumferential surface of the shielding member 51 surrounds the outer circumferential surface of the central nozzle 55 across an interval in the radial direction (in the direction orthogonal to the rotation axis A1). The central nozzle 55 is elevated or lowered together with the shielding member 51. The discharge port of the central nozzle 55 to discharge the processing fluid is disposed above the upper central opening 61 of the shielding member 51.

The central nozzle 55 is connected to an upper gas piping 56 that guides an inert gas to the central nozzle 55. The substrate processing apparatus 1 may include an upper thermoregulator 59 that heats or cools the inert gas to be discharged from the central nozzle 55. When an upper gas valve 57 interposed in the upper gas piping 56 is opened, the inert gas is continuously discharged downwardly from the discharge port of the central nozzle 55 at a flow rate corresponding to the opening degree of a flow rate adjusting valve 58 that changes the flow rate of the inert gas. The inert gas discharged from the central nozzle 55 is a nitrogen gas. The inert gas may be a gas other than the nitrogen gas such as a helium gas or an argon gas.

The inner circumferential surface of the shielding member 51 and the outer circumferential surface of the central nozzle 55 define a tubular upper gas flow passage 62 that extends vertically. The upper gas flow passage 62 is connected to an upper gas piping 63 that guides the inert gas to the upper central opening 61 of the shielding member 51. The substrate processing apparatus 1 may include an upper thermoregulator 66 that heats or cools the inert gas to be discharged from the upper central opening 61 of the shielding member 51. When an upper gas valve 64 interposed in the upper gas piping 63 is opened, the inert gas is continuously discharged downwardly from the upper central opening 61 of the shielding member 51 at a flow rate corresponding to the opening degree of a flow rate adjusting valve 65 that changes the flow rate of the inert gas. The inert gas discharged from the upper central opening 61 of the shielding member 51 is a nitrogen gas. The inert gas may be a gas other than the nitrogen gas such as a helium gas or an argon gas.

The plurality of nozzles include a lower-surface nozzle 71 that discharges the processing liquid to the center portion of the lower surface of the substrate W. The lower-surface nozzle 71 includes a nozzle disc portion that is disposed between the upper surface 12u of the spin base 12 and the lower surface of the substrate W, and a nozzle cylindrical portion that downwardly extends from the nozzle disc portion. The discharge port of the lower-surface nozzle 71 is opened at the center portion of the upper surface of the nozzle disc portion. When the substrate W is held on the spin chuck 10, the discharge port of the lower-surface nozzle 71 vertically faces the center portion of the lower surface of the substrate W.

The lower-surface nozzle 71 is connected to a heating fluid piping 72 that guides hot water (pure water at a temperature higher than the room temperature) serving as an example of heating fluid to the lower-surface nozzle 71. The pure water supplied to the lower-surface nozzle 71 is heated by a heater 75 that is interposed in the heating fluid piping 72. When a heating fluid valve 73 interposed in the heating fluid piping 72 is opened, the hot water is discharged continuously upwardly from the discharge port of the lower-surface nozzle 71 at a flow rate corresponding to the opening degree of a flow rate adjusting valve 74 that changes the flow rate of the hot water. This allows the hot water to be supplied to the lower surface of the substrate W.

Furthermore, the lower-surface nozzle 71 is connected to a cooling fluid piping 76 that guides cold water (pure water at a temperature lower than the room temperature) serving as an example of cooling fluid to the lower-surface nozzle 71. The pure water supplied to the lower-surface nozzle 71 is cooled by a cooler 79 interposed in the cooling fluid piping 76. When a cooling fluid valve 77 interposed in the cooling fluid piping 76 is opened, the cold water is continuously discharged upwardly from the discharge port of the lower-surface nozzle 71 at a flow rate associated with the opening degree of a flow rate adjusting valve 78 that changes the flow rate of the cold water. This allows the cold water to be supplied to the lower surface of the substrate W.

The outer circumferential surface of the lower-surface nozzle 71 and the inner circumferential surface of the spin base 12 define a tubular lower gas flow passage 82 that extends vertically. The lower gas flow passage 82 includes a lower central opening 81 that is opened at the center portion of the upper surface 12u of the spin base 12. The lower gas flow passage 82 is connected to a lower gas piping 83 that guides the inert gas to the lower central opening 81 of the spin base 12. The substrate processing apparatus 1 may include a lower thermoregulator 86 that heats or cools the inert gas to be discharged from the lower central opening 81 of the spin base 12. When a lower gas valve 84 interposed in the lower gas piping 83 is opened, the inert gas is continuously discharged upwardly from the lower central opening 81 of the spin base 12 at a flow rate corresponding to the opening degree of a flow rate adjusting valve 85 that changes the flow rate of the inert gas.

The inert gas discharged from the lower central opening 81 of the spin base 12 is a nitrogen gas. The inert gas may be a gas other than the nitrogen gas such as a helium gas or an argon gas. When the lower central opening 81 of the spin base 12 discharges the nitrogen gas with the substrate W held on the spin chuck 10, the nitrogen gas radially flows in all directions between the lower surface of the substrate W and the upper surface 12u of the spin base 12. This allows the space between the substrate W and the spin base 12 to be filled with the nitrogen gas.

Next, description will be made to a film thickness measuring unit 91.

Figure 3:
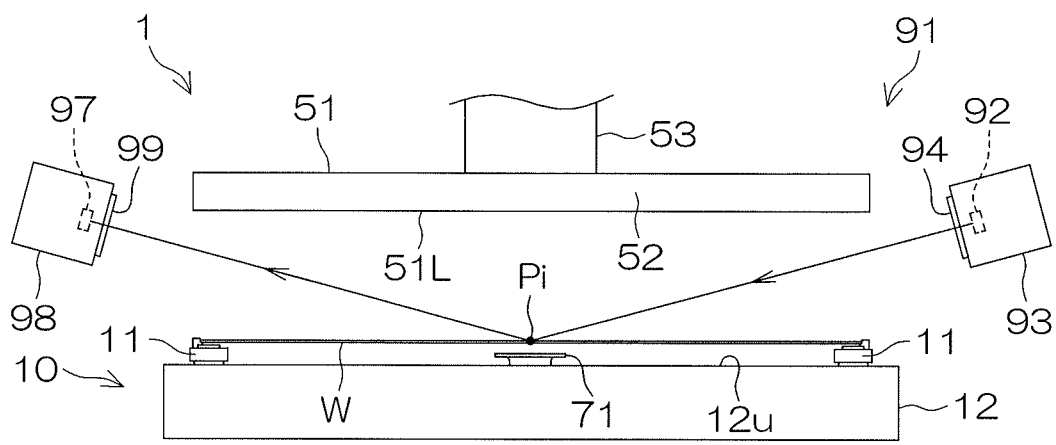
FIG. 3 is a schematic view of a film thickness measuring unit, a spin chuck and a shielding member when viewed horizontally.
Figure 4:
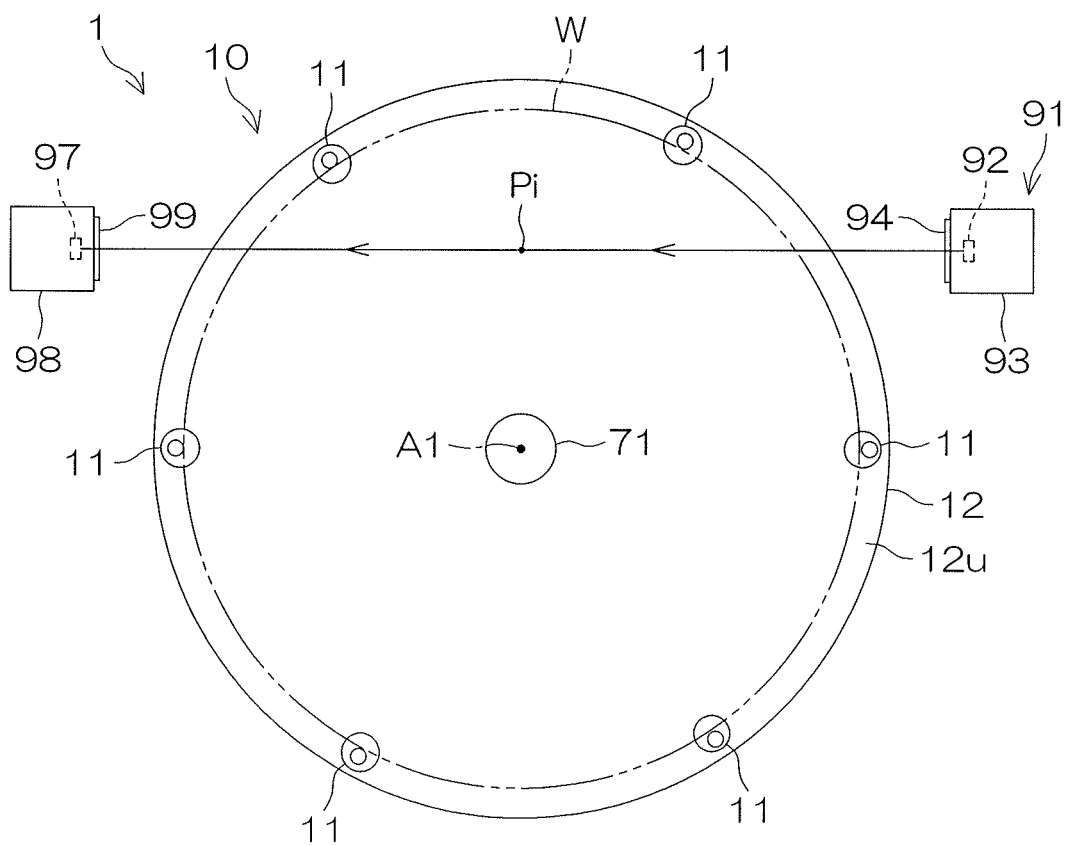
FIG. 4 is a schematic view of the film thickness measuring unit and the spin chuck when viewed from above.
Figure 5:
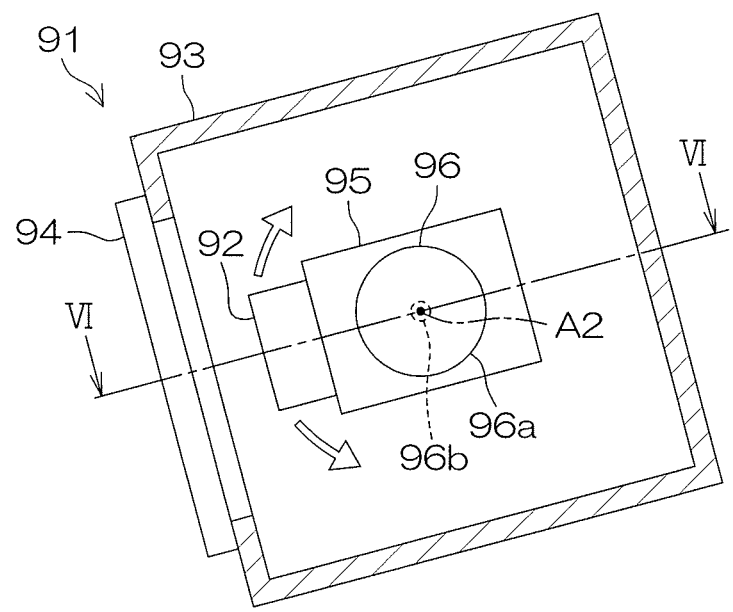
FIG. 5 is a cross-sectional view showing an interior of a housing that houses a light emitting device.
Figure 6:
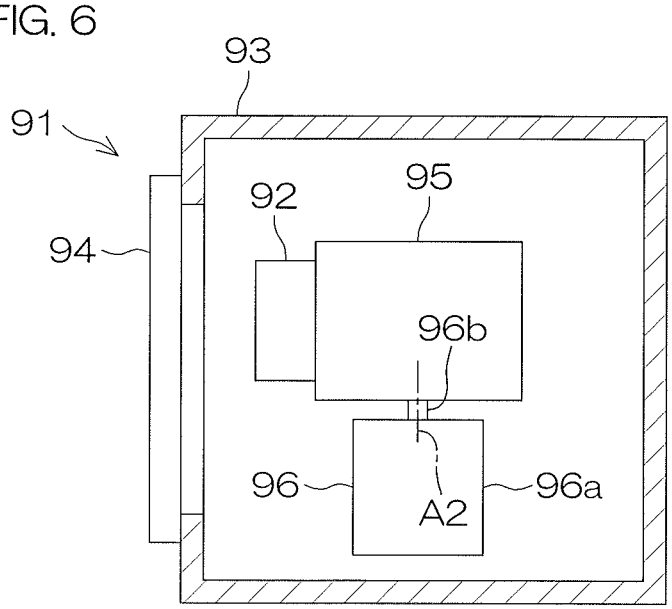
FIG. 6 is a cross-sectional view taken along line VI-VI shown in FIG. 5.

FIG. 3 is a schematic view of the film thickness measuring unit 91, the spin chuck 10 and the shielding member 51 when viewed horizontally. FIG. 4 is a schematic view of the film thickness measuring unit 91 and the spin chuck 10 when viewed from above. FIG. 5 is a cross-sectional view showing an interior of a housing 93 that houses a light emitting device 92. FIG. 6 is a cross-sectional view taken along line VI-VI shown in FIG. 5.

As shown in FIG. 3 and FIG. 4, the substrate processing apparatus 1 includes the film thickness measuring unit 91 that measures the thickness of a liquid film (film thickness) on the upper surface of the substrate W. The film thickness measuring unit 91 measures the film thickness using a spectroscopic interference method, for example. The film thickness measuring unit 91 includes a light emitting device 92 that emits light toward the upper surface of the substrate W held by the spin chuck 10 and a photo detector 97 that receives the light of the light emitting device 92 reflected by the upper surface of the substrate W. The light emitting device 92 and the photo detector 97 are disposed at positions in which they do not overlap the spin chuck 10 and the shielding member 51 in a plan view.

The light emitting device 92 is disposed in a housing 93. The photo detector 97 is disposed in a housing 98. The light of the light emitting device 92 is emitted out of the housing 93 through the opening of the housing 93 closed by a transparent plate 94. The light of the light emitting device 92 reflected by the upper surface of the substrate W enters the photo detector 97 through the opening of the housing 98 closed by a transparent plate 99. The black points Pi in FIG. 3 and FIG. 4 show incident positions in which the light of the light emitting device 92 comes into contact with the upper surface of the substrate W. The thickness of the liquid film on the substrate W is calculated based on the light entered the photo detector 97.

As shown in FIG. 5 and FIG. 6, the film thickness measuring unit 91 includes a holder 95 that holds the light emitting device 92 at the interior of the housing 93 and an electric motor 96 that moves the holder 95 with respect to the housing 93. The holder 95 and the electric motor 96 are housed in the housing 93. A rotor and a stator of the electric motor 96 are housed in a motor housing 96a, and a rotating shaft 96b of the electric motor 96 projects from the end surface of the motor housing 96a in the axial direction of the electric motor 96. The rotating shaft 96b is connected to the holder 95, and the motor housing 96a is connected to the housing 93.

The rotation angle of the electric motor 96 is controlled by the controller 3. When the electric motor 96 rotates the rotating shaft 96b, the holder 95 turns together with the light emitting device 92 around a horizontal turning axis A2 with respect to the housing 93. The white arrow in FIG. 5 denotes the turning of the light emitting device 92 around the turning axis A2. Thus, the incident position where the light of the light emitting device 92 comes into contact with the upper surface of the substrate W moves within the upper surface of the substrate W, and the incidence angle of the light of the light emitting device 92 with respect to the upper surface of the substrate W changes. Accordingly, it is possible to cause the light of the light emitting device 92 to come into contact with a plurality of positions within the upper surface of the substrate W by rotating the electric motor 96 and to measure the film thickness at a plurality of positions within the upper surface of the substrate W.

When the incident position and the incidence angle change, a path through which the reflected light (the light of the light emitting device 92 reflected by the upper surface of the substrate W) passes changes. The photo detector 97 may be movable to receive the reflected light even if the path of the reflected light has changed. For example, as with the light emitting device 92, an electric motor may be provided to move the photo detector with respect to the housing 98. Alternatively, a plurality of photo detectors 97 corresponding to the single light emitting device 92 may be provided.

In these cases, even when the incident position and the incidence angle change, the reflected light is received by the photo detector 97 and the thickness of the liquid film on the substrate W is measured.

When the thickness of the liquid film on the substrate W is measured, the controller 3 may cause the incident position to locate at a position where a distance in the horizontal direction from the rotation axis A1 is constant while causing the spin chuck 10 rotate the substrate W, or may move the incident position in a radical direction of the substrate W (a horizontal direction perpendicular to the rotation axis A1) while causing the spin chuck 10 rotate the substrate W. In the latter case, the average of a plurality of measured values may be treated as the film thickness.

Next, description will be made to a pre-drying processing liquid supplying unit 101.

Figure 7:
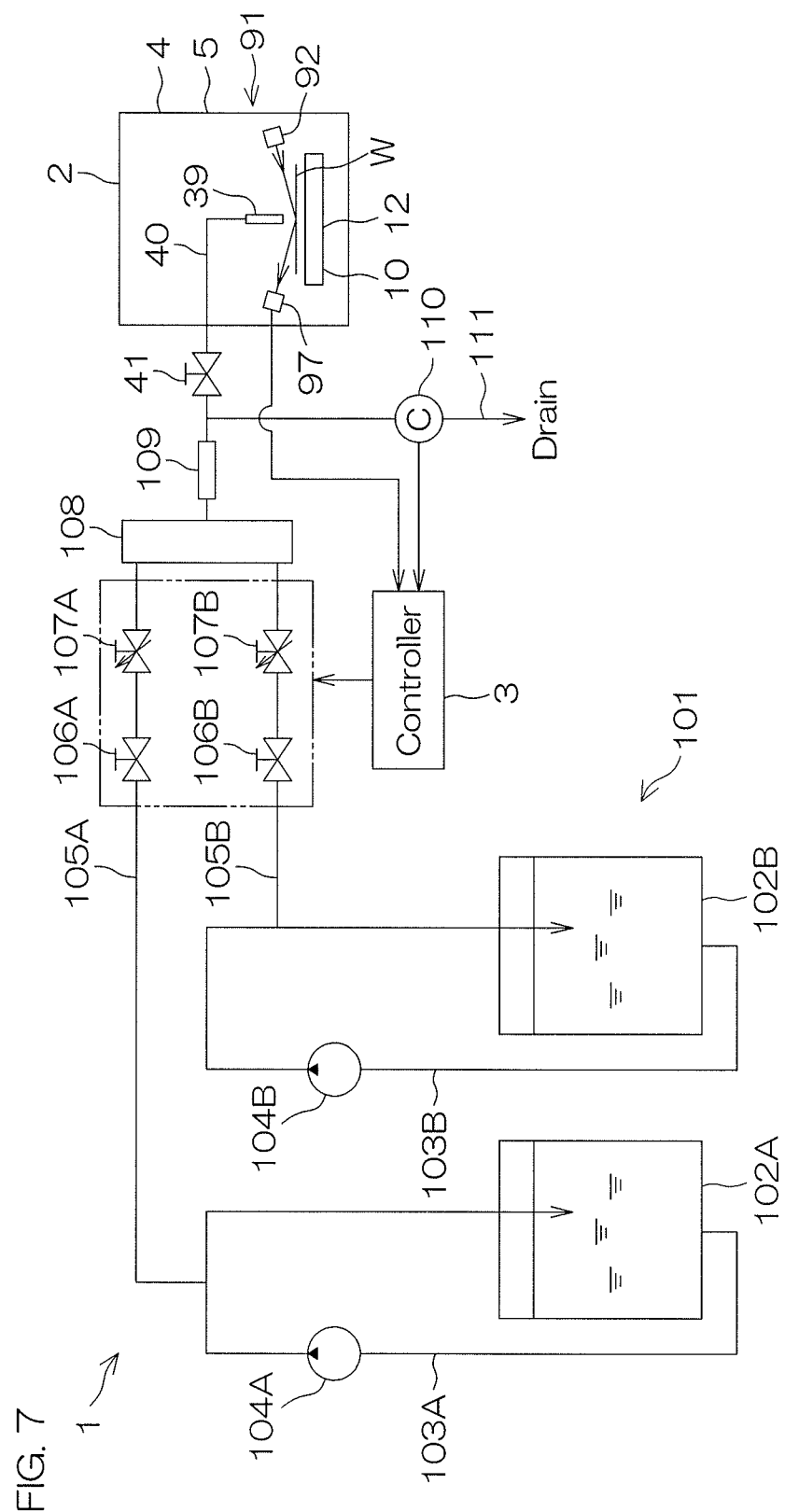
FIG. 7 is a schematic view showing a pre-drying processing liquid supplying unit provided in the substrate processing apparatus.

FIG. 7 is a schematic view showing the pre-drying processing liquid supplying unit 101 provided in the substrate processing apparatus 1.

The substrate processing apparatus 1 includes the pre-drying processing liquid supplying unit 101 that supplies the pre-drying processing liquid to the pre-drying processing liquid nozzle 39 through the pre-drying processing liquid piping 40. The pre-drying processing liquid supplying unit 101 includes a first tank 102A that corresponds to an undiluted liquid tank to store the undiluted liquid of the pre-drying processing liquid and a second tank 102B that corresponds to a solvent tank to store the solvent of the pre-drying processing liquid.

The undiluted liquid of the pre-drying processing liquid includes the sublimable substance and the solvent. The undiluted liquid of the pre-drying processing liquid is higher in the concentration of the sublimable substance than the pre-drying processing liquid to be supplied to the substrate W. The undiluted liquid of the pre-drying processing liquid is diluted by the solvent supplied from the second tank 102B and then supplied to the substrate W. If the sublimable substance is liquid at the room temperature, the undiluted liquid of the pre-drying processing liquid may not include the solvent.

The pre-drying processing liquid supplying unit 101 includes a first circulation piping 103A to circulate the undiluted liquid inside the first tank 102A, a first pump 104A to feed the undiluted liquid inside the first tank 102A to the first circulation piping 103A, and a first individual piping 105A that guides the undiluted liquid inside the first circulation piping 103A to the pre-drying processing liquid piping 40. The pre-drying processing liquid supplying unit 101 further includes a first opening/closing valve 106A to open/close the inside of the first individual piping 105A, and a first flow rate adjusting valve 107A that changes the flow rate of the pre-drying processing liquid supplied from the first individual piping 105A to the pre-drying processing liquid piping 40.

Similarly, the pre-drying processing liquid supplying unit 101 includes a second circulation piping 103B to circulate the solvent inside the second tank 102B, a second pump 104B to feed the solvent inside the second tank 102B to the second circulation piping 103B, and a second individual piping 105B that guides the solvent inside the second circulation piping 103B to the solvent piping 40. Furthermore, the pre-drying processing liquid supplying unit 101 includes a second opening/closing valve 106B to open/close the inside of the second individual piping 105B, and a second flow rate adjusting valve 107B that changes the flow rate of the solvent supplied from the second individual piping 105B to the pre-drying processing liquid piping 40.

The first individual piping 105A and the second individual piping 105B are connected to the pre-drying processing liquid piping 40 via a mixing valve 108 that generates the pre-drying processing liquid by mixing the undiluted liquid of the pre-drying processing liquid and the solvent. Not only the pre-drying processing liquid valve 41, but also an inline mixer 109 is interposed in the pre-drying processing liquid piping 40. The inline mixer 109 further mixes the pre-drying processing liquid generated by the mixing valve 108. Thus, the pre-drying processing liquid nozzle 39 is supplied with the pre-drying processing liquid in which the sublimable substance and the solvent are uniformly mixed.

The undiluted liquid of the pre-drying processing liquid supplied from the first tank 102A is supplied to the mixing valve 108 at a flow rate corresponding to the degree of opening of the first flow rate adjusting valve 107A. The solvent supplied from the second tank 102B is supplied to the mixing valve 108 at a flow rate corresponding to the degree of opening of the second flow rate adjusting valve 107B. Thus, it is possible to change the concentration of the sublimable substance in the pre-drying processing liquid to be supplied to the pre-drying processing liquid nozzle 39 by changing the degree of opening of the first flow rate adjusting valve 107A and the degree of opening of the second flow rate adjusting valve 107B.

The pre-drying processing liquid supplying unit 101 includes a concentration meter 110 that measures the concentration of the pre-drying processing liquid to be supplied to the pre-drying processing liquid nozzle 39. The pre-drying processing liquid supplying unit 101 includes a measuring pipe 111 that has diverged from the pre-drying processing liquid piping 40. The concentration meter 110 is interposed in the measuring pipe 111. FIG. 7 shows an example in which the measuring pipe 111 is connected to the pre-drying processing liquid piping 40 at a position that is downstream the inline mixer 109. Thus, in this example, the concentration of the pre-drying processing liquid that has passed through both of the mixing valve 108 and the inline mixer 109 is measured by the concentration meter 110. The concentration meter 110 may be interposed in the pre-drying processing liquid piping 40, not in the measuring pipe 111.

Figure 8:
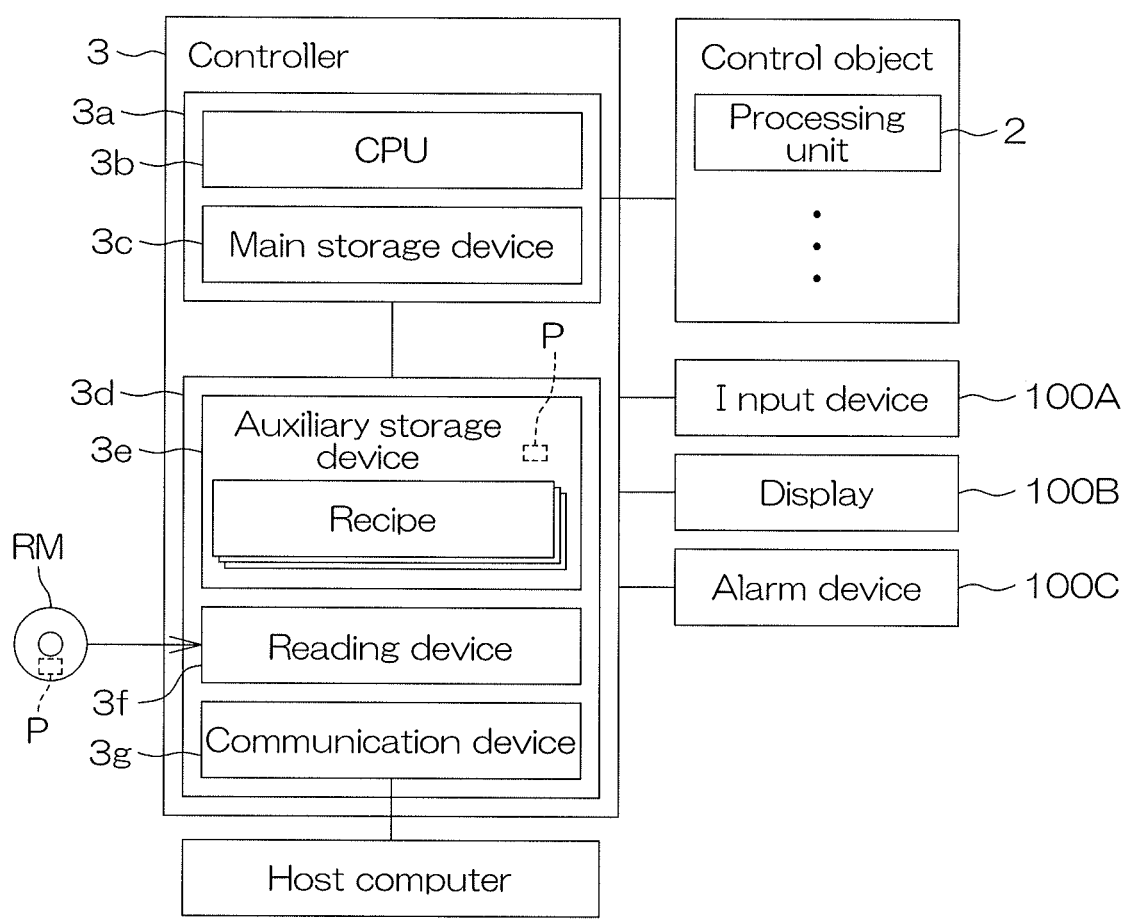
FIG. 8 is a block diagram showing the hardware of a controller.

FIG. 8 is a block diagram showing the hardware of the controller 3.

The controller 3 is a computer which includes a computer main body 3a and a peripheral device 3d which is connected to the computer main body 3a. The computer main body 3a includes a CPU 3b (central processing unit) which executes various types of commands and a main storage device 3c which stores information. The peripheral device 3d includes an auxiliary storage device 3e which stores information such as a program P, a reading device 3f which reads information from a removable medium RM and a communication device 3g which communicates with other devices such as a host computer.

The controller 3 is connected to an input device 100A, a display 100B and an alarm device 100C. The input device 100A is operated when an operator such as a user or a maintenance operator inputs information to the substrate processing apparatus 1. The information is displayed on the screen of the display 100B. The input device 100A may be any one of a keyboard, a pointing device and a touch panel or may be a device other than those. A touch panel display which serves both as the input device 100A and the display 100B may be provided in the substrate processing apparatus 1. The alarm device 100C generates an alarm using one or more of light, sound, characters, and graphics. When the input device 100A is touch panel display, the input device 100A may serve as the alarm device 100C.

The CPU 3b executes the program P stored in the auxiliary storage device 3e. The program P within the auxiliary storage device 3e may be previously installed in the controller 3, may be fed through the reading device 3f from the removable medium RM to the auxiliary storage device 3e or may be fed from an external device such as the host computer to the auxiliary storage device 3e through the communication device 3g.

The auxiliary storage device 3e and the removable medium RM are nonvolatile memories which retain memory even without power being supplied. The auxiliary storage device 3e is, for example, a magnetic storage device such as a hard disk drive. The removable medium RM is, for example, an optical disc such as a compact disc or a semiconductor memory such as a memory card. The removable medium RM is an example of a computer readable recording medium in which the program P is recorded. The removable medium RM is a non-transitory tangible recording medium.

The auxiliary storage device 3e stores a plurality of recipes. The recipe is information which specifies the details of processing, processing conditions and processing procedures of the substrate W. A plurality of recipes differ from each other in at least one of the details of processing, the processing conditions and the processing procedures of the substrate W. The controller 3 controls the substrate processing apparatus 1 such that the substrate W is processed according to the recipe designated by the host computer. The controller 3 executes individual steps described below by controlling the substrate processing apparatus 1. In other words, the controller 3 is programmed to execute the individual steps described below.

Next, description will be made to an example of processing the substrate W.

For example, the substrate W to be processed is a semiconductor wafer such as a silicon wafer. The front surface of the substrate W corresponds to the device formation surface on which devices such as transistors or capacitors are formed. The substrate W may be a substrate W having patterns PA (see FIG. 10A) formed on the front surface of the substrate W corresponding to a device formation surface, or alternatively, may be a substrate W having no patterns PA formed on the front surface of the substrate W. In the latter case, the patterns PA may be formed in a chemical liquid supplying step described below.

First Processing Example

First, an example to process the substrate W (the first processing example) in which the pre-drying processing liquid is a solution of camphor and IPA shall be described.

Figure 9:
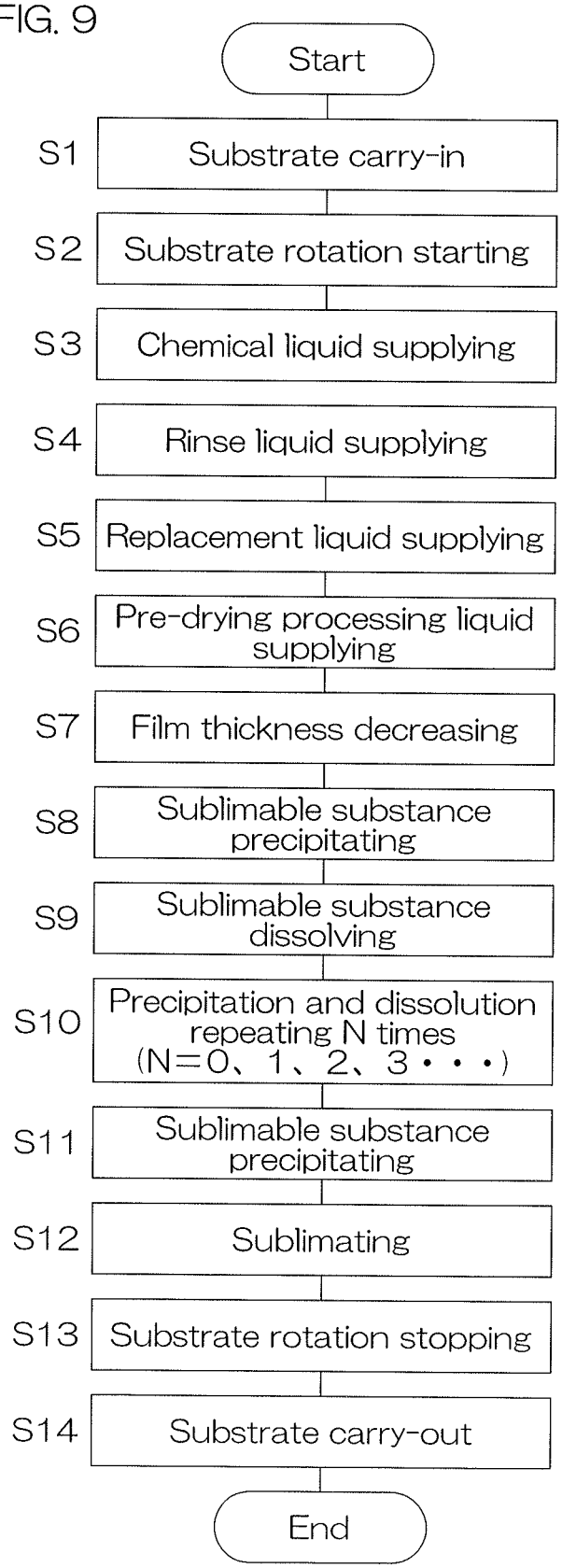
FIG. 9 is a process chart for describing substrate processing performed by the substrate processing apparatus.
Figure 10A:
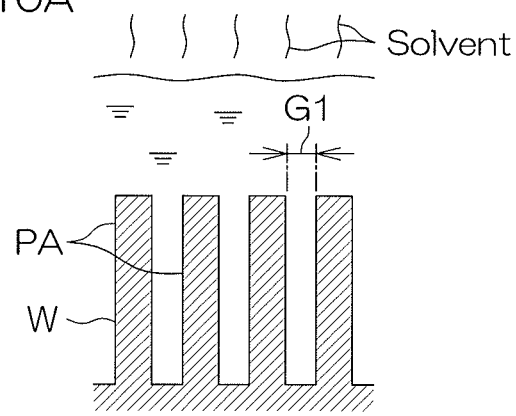
FIG. 10A is a schematic view showing a state of the substrate when a solution of camphor and IPA is used.

FIG. 9 is a process chart for describing substrate processing performed by the substrate processing apparatus 1. FIG. 10A to FIG. 10F are schematic views showing states of the substrate W when the solution of camphor and IPA is used. FIG. 11 is an equilibrium diagram of camphor and IPA. "RT" in FIG. 11 denotes the room temperature. Hereinafter, FIG. 2 and FIG. 9 shall be referenced. FIG. 10A to FIG. 10F and FIG. 11 shall be referenced where suitable.

When the substrate W is processed in the substrate processing apparatus 1, a carry-in step (step S1 in FIG. 9) is performed to carry the substrate W into the chamber 4.

Specifically, while the shielding member 51 is located at the upper position, all the guards 24 are located at the lower position, and all scan nozzles are located at the standby position, the center robot CR (see FIG. 1) causes a hand H1 to enter the chamber 4 while supporting the substrate W with the hand H1. Then, the center robot CR places the substrate W in the hand H1 on the plurality of chuck pins 11 while the front surface of the substrate W is directed upwardly. Thereafter, the plurality of chuck pins 11 are pushed against the outer circumferential surface of the substrate W to thereby grip the substrate W. The center robot CR retracts the hand H1 out of the chamber 4 after having placed the substrate W on the spin chuck 10.

Next, the upper gas valve 64 and the lower gas valve 84 are opened, and the upper central opening 61 of the shielding member 51 and the lower central opening 81 of the spin base 12 start to discharge the nitrogen gas. This allows the space between the substrate W and the shielding member 51 to be filled with the nitrogen gas. Similarly, the space between the substrate W and the spin base 12 is filled with the nitrogen gas. Meanwhile, the guard elevating/lowering unit 27 elevates at least one guard 24 from the lower position to the upper position. Thereafter, the spin motor 14 is driven, and the rotation of the substrate W is started (step S2 in FIG. 9). This allows the substrate W to be rotated at a liquid supplying speed.

Next, the chemical liquid supplying step (step S3 in FIG. 9) is performed to supply a chemical liquid onto the upper surface of the substrate W and thereby form a liquid film of the chemical liquid that covers the entire upper surface of the substrate W.

Specifically, with the shielding member 51 located at the upper position and at least one guard 24 located at the upper position, the nozzle moving unit 34 moves the chemical liquid nozzle 31 from the standby position to the processing position. Thereafter, the chemical liquid valve 33 is opened, and the chemical liquid nozzle 31 starts to discharge the chemical liquid. When a predetermined time has elapsed after the chemical liquid valve 33 is opened, the chemical liquid valve 33 is closed, so that the discharge of the chemical liquid is stopped. Thereafter, the nozzle moving unit 34 moves the chemical liquid nozzle 31 to the standby position.

The chemical liquid discharged from the chemical liquid nozzle 31 collides with the upper surface of the substrate W that is rotating at the liquid supplying speed, and then, flows outwardly along the upper surface of the substrate W due to centrifugal force. Thus, the chemical liquid is supplied to the entire upper surface of the substrate W to thereby form the liquid film of the chemical liquid that covers the entire upper surface of the substrate W. While the chemical liquid nozzle 31 is discharging the chemical liquid, the nozzle moving unit 34 may move a liquid landing position so that the liquid landing position of the chemical liquid passes the center portion and the outer circumference portion of the upper surface of the substrate W, or alternatively, may bring the liquid landing position to a standstill at the center portion.

Next, a rinse liquid supplying step (step S4 in FIG. 9) is performed to supply pure water serving as an example of rinse liquid to the upper surface of the substrate W and thereby wash away the chemical liquid on the substrate W.

Specifically, with the shielding member 51 located at the upper position and at least one guard 24 located at the upper position, the nozzle moving unit 38 moves the rinse liquid nozzle 35 from the standby position to the processing position. Thereafter, the rinse liquid valve 37 is opened, and the rinse liquid nozzle 35 starts to discharge the rinse liquid. Before the pure water starts to be discharged, the guard elevating/lowering unit 27 may vertically move at least one guard 24 in order to switch the guard 24 that receives the liquid discharged from the substrate W. When a predetermined time has elapsed after the rinse liquid valve 37 is opened, the rinse liquid valve 37 is closed, so that the discharge of the rinse liquid is stopped. Thereafter, the nozzle moving unit 38 moves the rinse liquid nozzle 35 to the standby position.

The pure water discharged from the rinse liquid nozzle 35 collides with the upper surface of the substrate W that is rotating at the liquid supplying speed, and then, flows outwardly along the upper surface of the substrate W due to centrifugal force. The chemical liquid on the substrate W is replaced with the pure water discharged from the rinse liquid nozzle 35. This allows a liquid film of the pure water covering the entire upper surface of the substrate W to be formed. While the rinse liquid nozzle 35 is discharging the pure water, the nozzle moving unit 38 may move a liquid landing position so that the liquid landing position of the pure water passes the center portion and the outer circumference portion of the upper surface of the substrate W, or alternatively, may bring the liquid landing position to a standstill at the center portion.

Next, a replacement liquid supplying step (step S5 in FIG. 9) is performed to supply a replacement liquid that dissolves with both the rinse liquid and the pre-drying processing liquid to the upper surface of the substrate W and then replace the pure water on the substrate W with the replacement liquid.

Specifically, with the shielding member 51 located at the upper position and at least one guard 24 located at the upper position, the nozzle moving unit 46 moves the replacing liquid nozzle 43 from the standby position to the processing position. Thereafter, the replacing liquid valve 45 is opened, and the replacing liquid nozzle 43 starts to discharge the replacement liquid. Before the replacement liquid starts to be discharged, the guard elevating/lowering unit 27 may vertically move at least one guard 24 in order to switch the guard 24 that receives the liquid discharged from the substrate W. When a predetermined time has elapsed after the replacing liquid valve 45 is opened, the replacing liquid valve 45 is closed, so that the discharge of the replacement liquid is stopped. Thereafter, the nozzle moving unit 46 moves the replacing liquid nozzle 43 to the standby position.

The replacement liquid discharged from the replacing liquid nozzle 43 collides with the upper surface of the substrate W that is rotating at the liquid supplying speed, and then, flows outwardly along the upper surface of the substrate W due to centrifugal force. The pure water on the substrate W is replaced with the replacement liquid discharged from the replacing liquid nozzle 43. This allows a liquid film of the replacement liquid covering the entire upper surface of the substrate W to be formed. While the replacing liquid nozzle 43 is discharging the replacement liquid, the nozzle moving unit 46 may move a liquid landing position so that the liquid landing position of the replacement liquid passes the center portion and the outer circumference portion of the upper surface of the substrate W, or alternatively, may bring the liquid landing position to a standstill at the center portion. After the liquid film of the replacement liquid covering the entire upper surface of the substrate W is formed, the substrate W may be rotated at a paddle speed (e.g., at a speed greater than zero and 20 rpm or less) while the discharge of the replacement liquid from the replacing liquid nozzle 43 is stopped.

Next, a pre-drying processing liquid supplying step (step S6 in FIG. 9) is performed to supply the pre-drying processing liquid to the upper surface of the substrate W and thereby form a liquid film of the pre-drying processing liquid on the substrate W.

Specifically, with the shielding member 51 located at the upper position and at least one guard 24 located at the upper position, the nozzle moving unit 42 moves the pre-drying processing liquid nozzle 39 from the standby position to the processing position. Thereafter, the pre-drying processing liquid valve 41 is opened, and the pre-drying processing liquid nozzle 39 starts to discharge the pre-drying processing liquid. Before the pre-drying processing liquid starts to be discharged, the guard elevating/lowering unit 27 may vertically move at least one guard 24 in order to switch the guard 24 that receives the liquid discharged from the substrate W. When a predetermined time has elapsed after the pre-drying processing liquid valve 41 is opened, the pre-drying processing liquid valve 41 is closed, so that the discharge of the pre-drying processing liquid is stopped. Thereafter, the nozzle moving unit 42 moves the pre-drying processing liquid nozzle 39 to the standby position.

The pre-drying processing liquid discharged from the pre-drying processing liquid nozzle 39 collides with the upper surface of the substrate W that is rotating at the liquid supplying speed, and then, flows outwardly along the upper surface of the substrate W due to centrifugal force. The replacement liquid on the substrate W is replaced with the pre-drying processing liquid discharged from the pre-drying processing liquid nozzle 39. This allows a liquid film of the pre-drying processing liquid covering the entire upper surface of the substrate W to be formed. While the pre-drying processing liquid nozzle 39 is discharging the pre-drying processing liquid, the nozzle moving unit 42 may move a liquid landing position so that the liquid landing position of the pre-drying processing liquid passes the center portion and the outer circumference portion of the upper surface of the substrate W, or alternatively, may bring the liquid landing position to a standstill at the center portion.

Next, a film thickness decreasing step (step S7 in FIG. 9) is performed to decrease the film thickness (the thickness of the liquid film) of the pre-drying processing liquid on the substrate W while maintaining the state that the entire upper surface of the substrate W is covered with the liquid film of the pre-drying processing liquid.

Specifically, the shielding member elevating/lowering unit 54 moves the shielding member 51 from the upper position to the lower position. With the shielding member 51 located at the lower position and at least one guard 24 located at the upper position, the spin motor 14 maintains the rotational speed of the substrate W at a film thickness decreasing speed. The film thickness decreasing speed may be equal to or different from the liquid supplying speed. The pre-drying processing liquid on the substrate W is discharged outwardly from the substrate W due to centrifugal force even after the discharge of the pre-drying processing liquid is stopped. Thus, the film thickness of the pre-drying processing liquid on the substrate W is decreased. When the pre-drying processing liquid on the substrate W is discharged to a certain extent, the amount of the pre-drying processing liquid discharged from the substrate W per unit time is reduced to zero or generally zero. Thereby, the film thickness of the pre-drying processing liquid on the substrate W is stabilized at a value corresponding to the rotational speed of the substrate W.

After the film thickness of the pre-drying processing liquid is decreased in the film thickness decreasing step (step S7 in FIG. 9), a first precipitation step (step S8 in FIG. 9) is performed to precipitate a solid 121 of the sublimable substance (refer to FIG. 10B) into the pre-drying processing liquid on the substrate W.

Specifically, the shielding member 51 located at the lower position and at least one guard 24 located at the upper position, the spin motor 14 maintains the rotational speed of the substrate W at a first precipitation speed. The first precipitation speed may be equal to or different from the liquid supplying speed. Since the vapor pressure of the solvent is higher than the vapor pressure of the sublimable substance, the solvent evaporates from the surface of the pre-drying processing liquid at an evaporation speed higher than an evaporation speed of the sublimable substance while the substrate is rotating at the first precipitation speed. FIG. 10A shows a state in which the solvent evaporates from the surface of the pre-drying processing liquid.

As the solvent continues to evaporate, the concentration of the sublimable substance at the surface of the pre-drying processing liquid and its vicinity gradually increases, while the film thickness of the pre-drying processing liquid gradually decreases. The vaporization of the solvent from the pre-drying processing liquid is performed without forcibly heating the pre-drying processing liquid on the substrate W, for example. Thus, the solvent is evaporated from the pre-drying processing liquid while keeping the pre-drying processing liquid on the substrate W at or slightly below the room temperature. When the concentration of the sublimable substance at the surface of the pre-drying processing liquid and its vicinity reaches the saturating concentration of the sublimable substance in the pre-drying processing liquid, as shown in FIG. 10B, the solid 121 of the sublimable substance precipitates at the surface of the pre-drying processing liquid.

Figure 10B:
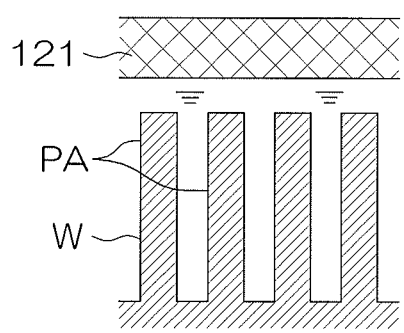
FIG. 10B is a schematic view showing a state of the substrate when the solution of camphor and IPA is used.
Figure 11:
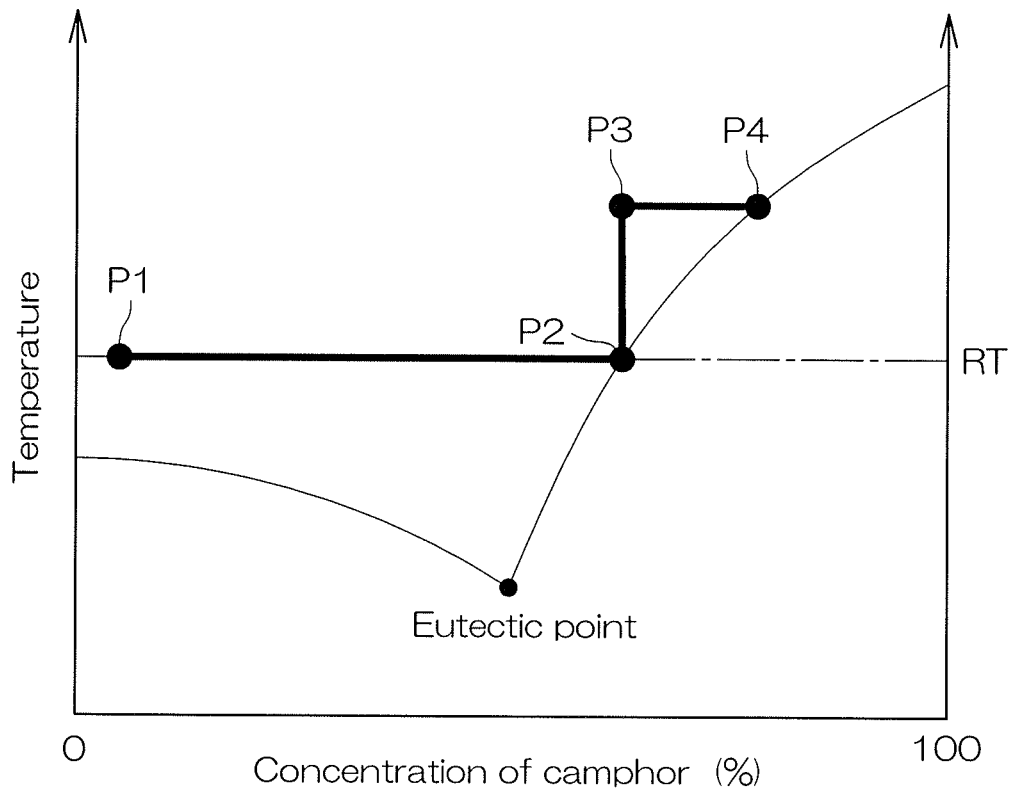
FIG. 11 is an equilibrium diagram of camphor and IPA.

As shown in FIG. 10B, when the solid 121 of the sublimable substance precipitates, all or a portion of the bulk of the pre-drying processing liquid, that is, all or a portion of the pre-drying processing liquid existing in a range from the surface (liquid surface) of the pre-drying processing liquid to the upper surface of the pattern PA changes into the solid 121 of the sublimable substance. FIG. 10B shows an example in which only a portion of the bulk of the pre-drying processing liquid on the surface side of the pre-drying processing liquid changes into the solid 121 of the sublimable substance, and the remaining portion of the bulk is kept liquid. In this example, the solid 121 of the sublimable substance does not reach the upper surface of the pattern PA, and the pre-drying processing liquid exists not only between the patterns PA but also between the solid 121 of the sublimable substance and the upper surface of the pattern PA. All or a portion of the surface of the pre-drying processing liquid is covered by a solidified film, that is, the film-shaped solid 121 of the sublimable substance horizontally extending.

Next, a first dissolving step (step S9 in FIG. 9) is performed to dissolve the solid 121 of the sublimable substance in the pre-drying processing liquid on the substrate W.

Specifically, with the shielding member 51 located at the lower position and at least one guard 24 located at the upper position, the spin motor 14 maintains the rotational speed of the substrate W at a first dissolving speed. The first dissolving speed may be equal to or different from the liquid supplying speed. Furthermore, the heating fluid valve 73 is opened and the lower-surface nozzle 71 starts to discharge hot water (pure water at a temperature higher than the room temperature). Before the hot water starts to be discharged, the guard elevating/lowering unit 27 may vertically move at least one guard 24 in order to switch the guard 24 that receives the liquid discharged from the substrate W.

The hot water discharged from the lower-surface nozzle 71 collides with the central portion of the lower surface of the substrate W that is rotating at the first dissolving speed, and then, flows outwardly along the lower surface of the substrate W due to centrifugal force. Thus, the entirety of the substrate W is heated at a heating temperature that is higher than the room temperature. The heat of the hot water is transmitted to the pre-drying processing liquid on the substrate W through the substrate W. The pre-drying processing liquid on the substrate W is indirectly heated through the substrate W. Thus, the temperatures of the solid 121 of the sublimable substance and the pre-drying processing liquid on the substrate W are maintained at temperatures higher than the room temperature.

Figure 10C:
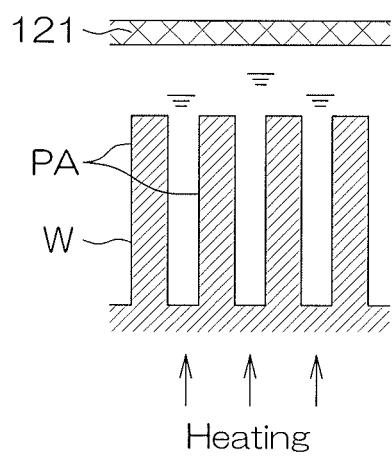
FIG. 10C is a schematic view showing a state of the substrate when the solution of camphor and IPA is used.
Figure 10D:
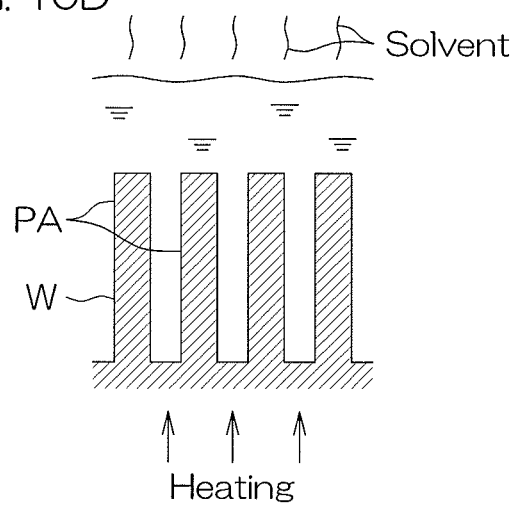
FIG. 10D is a schematic view showing a state of the substrate when the solution of camphor and IPA is used.

As shown in FIG. 10C, when the temperature of the pre-drying processing liquid on the substrate W is raised, the saturating concentration of the sublimable substance in the pre-drying processing liquid increases, and the solid 121 of the sublimable substance dissolves in the pre-drying processing liquid on the substrate W. The dissolution of the solid 121 of the sublimable substance in the pre-drying processing liquid is urged by an increase in the temperature of the pre-drying processing liquid. Thus, all or the most portion of the solid 121 of the sublimable substance dissolves in the pre-drying processing liquid on the substrate W. FIG. 10D shows an example in which all of the solid 121 of the sublimable substance dissolve in the pre-drying processing liquid.

After the solid 121 of the sublimable substance is dissolved in the pre-drying processing liquid, the solid 121 of the sublimable substance may be precipitated again and the precipitated solid 121 of the sublimable substance may be dissolved in the pre-drying processing liquid again. That is, a repetitive cycle from the first precipitation step (step S8 in FIG. 9) to the first dissolving step (step S9 in FIG. 9) may be performed more than once (step S10 in FIG. 9). "N" of step S10 in FIG. 9 refers to an integer greater than or equal to 0. When the N is greater than or equal to 1, the repetitive cycle is performed more than once. When the N is 0, only the first precipitation step (step S8 in FIG. 9) and the first dissolving step (step S9 in FIG. 9) are performed, and the second and subsequent precipitations and dissolutions are not performed.

After the solid 121 of the sublimable substance is dissolved in the pre-drying processing liquid, a final precipitation step (step S11 in FIG. 9) is performed to precipitate the solid 121 of the sublimable substance again.

Specifically, with the shielding member 51 located at the lower position and at least one guard 24 located at the upper position, the spin motor 14 maintains the rotational speed of the substrate W at a final precipitation speed. The final precipitation speed may be equal to or different from the liquid supplying speed. The lower-surface nozzle 71 continues to discharge the hot water from the first dissolving step (step S9 in FIG. 9). Thus, the pre-drying processing liquid on the substrate W is maintained at a temperature higher than the room temperature even while the substrate W rotates at the final precipitation speed.

Figure 10E:
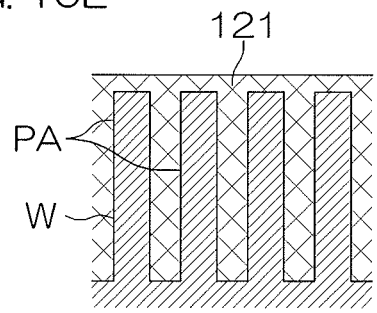
FIG. 10E is a schematic view showing a state of the substrate when the solution of camphor and IPA is used.

As shown in FIG. 10D, the solvent evaporates from the surface of the pre-drying processing liquid while the substrate W rotates at the final precipitation speed. Thus, the concentration of the sublimable substance in the pre-drying processing liquid gradually increases while the surface of the pre-drying processing liquid gradually approaches the root portion of the pattern PA. When the concentration of the sublimable substance in the pre-drying processing liquid reaches the saturating concentration of the sublimable substance in the pre-drying processing liquid, the solid 121 of the sublimable substance precipitates at the upper surface of the substrate W, and all or almost all of the pre-drying processing liquid disappear from the substrate W. FIG. 10E shows an example in which all of the pre-drying processing liquid disappear from the substrate W and the solid 121 of the sublimable substance precipitates between the patterns PA. FIG. 10E shows an example in which the thickness of the solid 121 of the sublimable substance is greater than the height of the pattern PA.

FIG. 11 is an equilibrium diagram of camphor and IPA. The solution of camphor and IPA corresponds to the pre-drying processing liquid. Curves in FIG. 11 (freezing curve) shows freezing points of the solution of camphor and IPA. A thick broken line in FIG. 11 shows a transition of the concentration of camphor and the temperature of the solution while the first precipitation step (step S8 in FIG. 9), the first dissolving step (step S9 in FIG. 9) and the final precipitation step (step S11 in FIG. 9) are being performed.

In FIG. 11, a thick straight line from a point P1 to a point P2 shows that the first precipitation step (step S8 in FIG. 9) is being performed. When the first precipitation step (step S8 in FIG. 9) is being performed, IPA evaporates from the solution of camphor and IPA, which corresponds to the pre-drying processing liquid, and the concentration of camphor gradually increases. At the same time, the temperature of the pre-drying processing liquid is maintained at the room temperature or its vicinity. When the concentration of camphor increases to the concentration of the point P2 in FIG. 11, the solid 121 of the sublimable substance containing camphor and IPA is formed by the precipitation or solidification.

In FIG. 11, a thick straight line from the point P2 to a point P3 shows that the first dissolving step (step S9 in FIG. 9) is being performed. When the first dissolving step (step S9 in FIG. 9) is being performed, the temperature of the solution of camphor and IPA increases and the temperature of the solid 121 of the sublimable substance increases to a temperature higher than the freeze point of the solution of camphor and IPA. Thus, at least a portion of the solid 121 of the sublimable substance melts or dissolves, and return to the solution of camphor and IPA.

In FIG. 11, a thick straight line from the point P3 to a point P4 shows that the final precipitation step (step S11 in FIG. 9) is being performed. As described above, when the final precipitation step (step S11 in FIG. 9) is being performed, in order to precipitate the solid 121 of the sublimable substance again, IPA is further evaporated while keeping the solution of camphor and IPA at a temperature higher than the room temperature rather than lowering the temperature of the solution of camphor and IPA. Thus, the contained amount of IPA in the solid 121 of the sublimable substance is smaller than that of IPA in the solid 121 of the sublimable substance precipitated in the first precipitation step (step S8 in FIG. 9).

After the solid 121 of the sublimable substance precipitates between the patterns PA, a sublimating step (step S12 in FIG. 9) is performed to sublimate the solid 121 of the sublimable substance on the substrate W and thereby remove the solid 121 of the sublimable substance from the upper surface of the substrate W.

Specifically, with the shielding member 51 located at the lower position, the spin motor 14 maintains the rotational speed of the substrate W at a sublimating speed. The sublimating speed may be equal to or different from the liquid supplying speed. Furthermore, the upper gas valve 57 is opened to cause the central nozzle 55 to start to discharge the nitrogen gas. In addition to or in place of opening the upper gas valve 57, the opening degree of the flow rate adjusting valve 65 may be changed to increase the flow rate of the nitrogen gas discharged from the upper central opening 61 of the shielding member 51.

Figure 10F:
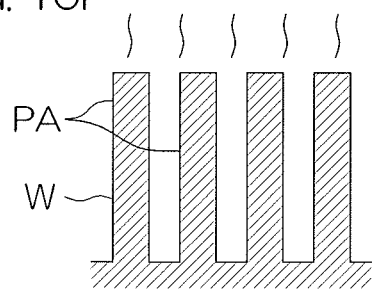
FIG. 10F is a schematic view showing a state of the substrate when the solution of camphor and IPA is used.

When the rotation of the substrate W at the sublimating speed and so on are started, the solid 121 of the sublimable substance on the substrate W starts to sublimate, so that a gas containing a sublimable substance is generated from the solid 121 of the sublimable substance on the substrate W. The gas generated from the solid 121 of the sublimable substance (a gas containing the sublimable substance) radially flows through the space between the substrate W and the shielding member 51 and is removed from the space over the substrate W. When a certain time has elapsed after the sublimating started, as shown in FIG. 10F, all the solid 121 of the sublimable substance is removed from the substrate W. Thereafter, the spin motor 14 is stopped and the rotation of the substrate W is stopped (step S13 in FIG. 9). Furthermore, the upper gas valve 57 is closed to cause the central nozzle 55 to stop discharging the nitrogen gas.

Next, a carry-out step (step S14 in FIG. 9) is performed to carry the substrate W out of the chamber 4.

Specifically, the shielding member elevating/lowering unit 54 elevates the shielding member 51 to the upper position, and the guard elevating/lowering unit 27 lowers all the guards 24 to the lower position. Furthermore, the upper gas valve 64 and the lower gas valve 84 are closed, so that the upper central opening 61 of the shielding member 51 and the lower central opening 81 of the spin base 12 stop discharging the nitrogen gas. Thereafter, the center robot CR causes the hand H1 to enter the chamber 4. After the plurality of chuck pins 11 release the gripping of the substrate W, the center robot CR supports the substrate W on the spin chuck 10 with the hand H1. Thereafter, while supporting the substrate W with the hand H1, the center robot CR retracts the hand H1 out of the chamber 4. This allows the processed substrate W to be carried out of the chamber 4.

Second Processing Example

Next, an example to process the substrate W (the second processing example) in which the pre-drying processing liquid is a solution of camphor and methanol shall be described.

The general flow of the second processing example is the same as that of the first processing example and it is shown in FIG. 9. The second processing example is different from the first processing example in the flow from the first dissolving step (step S9 in FIG. 9) to the final precipitation step (step S11 in FIG. 9) and steps other than these are the same as these of the first processing example. Thus, hereinafter, the flow of the second processing example from the first dissolving step to the final precipitation step shall be described.

FIG. 12A to FIG. 12D are schematic views showing states of the substrate W when a solution of camphor and methanol is used. Hereinafter, FIG. 2 and FIG. 9 shall be referenced. FIG. 12A to FIG. 12D shall be referenced where suitable.

After the solid 121 of the sublimable substance precipitates in the first precipitation step (step S8 in FIG. 9), a first dissolving step (step S9 in FIG. 9) is performed to dissolve the solid 121 of the sublimable substance in the pre-drying processing liquid on the substrate W.

Specifically, with the shielding member 51 located at the lower position and at least one guard 24 located at the upper position, the spin motor 14 maintains the rotational speed of the substrate W at a first dissolving speed. The first dissolving speed may be equal to or different from the liquid supplying speed. When the substrate W is rotating at the first dissolving speed, the controller 3 may close the upper gas valve 64 to stop the discharge of the nitrogen gas from the upper central opening 61 of the shielding member 51. Alternatively, the controller 3 decreases the flow rate of the nitrogen gas to be discharged from the upper central opening 61 of the shielding member 51 by changing the opening degree of the flow rate adjusting valve 65.

Figure 12A:
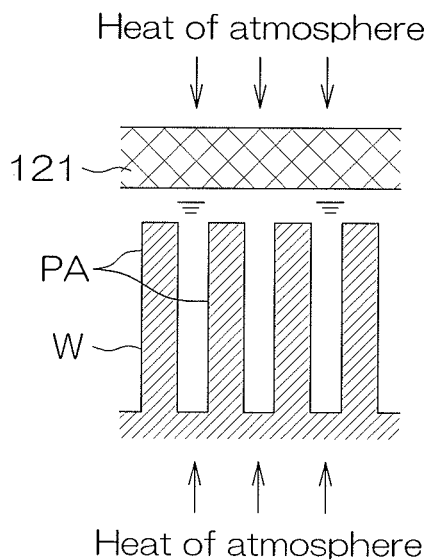
FIG. 12A is a schematic view showing a state of the substrate when a solution of camphor and methanol is used.

When the solvent evaporates from the pre-drying processing liquid in the first precipitation step (step S8 in FIG. 9), the heat of the pre-drying processing liquid, which corresponds to the heat of vaporization, is released into the atmosphere in the chamber 4 together with the solvent and the temperature of the surface of the pre-drying processing liquid decreases. When the solid 121 of the sublimable substance is formed, the solvent to evaporate from the pre-drying processing liquid decreases, so that the heat of the pre-drying processing liquid to be released into the atmosphere also decreases. At the same time, as shown in FIG. 12A, the heat in the atmosphere is transmitted to the pre-drying processing liquid via the solid 121 of the sublimable substance. Thus, the temperatures of the solid 121 of the sublimable substance and the pre-drying processing liquid on the substrate W increase.

Figure 12B:
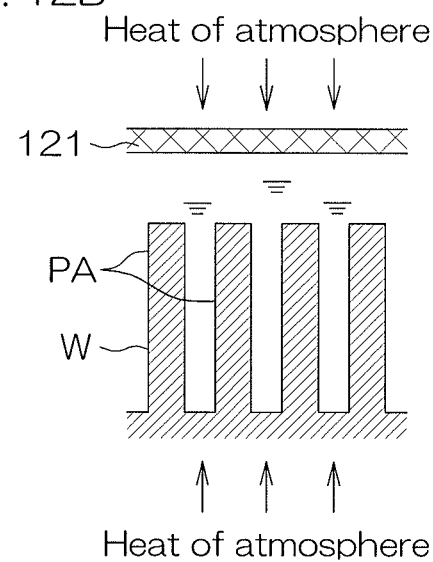
FIG. 12B is a schematic view showing a state of the substrate when the solution of camphor and methanol is used.
Figure 12C:
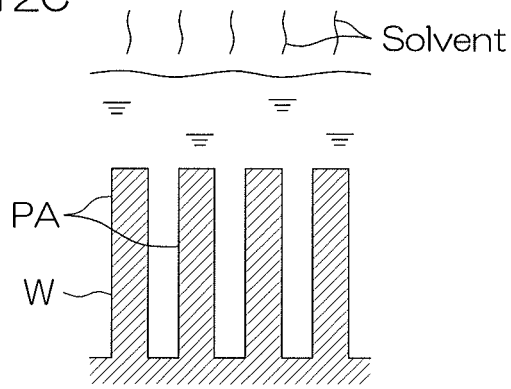
FIG. 12C is a schematic view showing a state of the substrate when the solution of camphor and methanol is used.

When the temperatures of the solid 121 of the sublimable substance and the pre-drying processing liquid on the substrate W increase, as shown in FIG. 12B, a portion of the solid 121 of the sublimable substance dissolves in the pre-drying processing liquid. The pre-drying processing liquid is the solution of camphor and methanol. The solid 121 of the sublimable substance includes camphor. The solubility of camphor with respect to methanol is greater than the solubility of camphor with respect to IPA, and camphor is easy to dissolve in methanol. When a portion of the solid of camphor dissolves in the liquid of methanol, the remaining solid of camphor also dissolves immediately in the liquid of methanol. Thus, all or the most portion of the solid 121 of the sublimable substance dissolves in the pre-drying processing liquid on the substrate W. FIG. 12C shows an example in which all of the solid 121 of the sublimable substance dissolve in the pre-drying processing liquid.

Figure 12D:
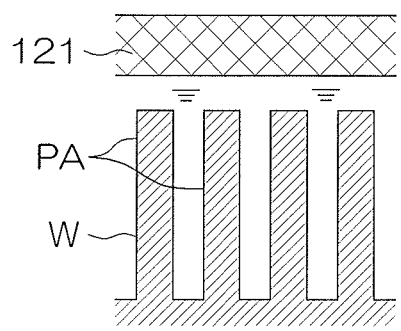
FIG. 12D is a schematic view showing a state of the substrate when the solution of camphor and methanol is used.

When the solid 121 of the sublimable substance dissolves in the pre-drying processing liquid on the substrate W, the solvent to evaporate from the pre-drying processing liquid increases and the temperature of the surface of the pre-drying processing liquid decreases. Thus, as shown in FIG. 12D, the concentration of the sublimable substance at the surface of the pre-drying processing liquid increases and the solid 121 of the sublimable substance precipitates again at the surface of the pre-drying processing liquid (step S10 in FIG. 9). When the solid 121 of the sublimable substance precipitates again, the temperatures of the solid 121 of the sublimable substance and the pre-drying processing liquid increases in a manner described above, the solid 121 of the sublimable substance dissolves again in the pre-drying processing liquid (step S10 in FIG. 9).

In this way, when the pre-drying processing liquid is the solution of camphor and methanol, the precipitation and dissolution of the solid 121 of the sublimable substance are repeated merely by leaving the pre-drying processing liquid on the upper surface of the substrate W, without forcibly changing the temperature of the pre-drying processing liquid. The number of times to repeat the single repetitive cycle from the first precipitation step (step S8 in FIG. 9) to the first dissolving step (step S9 in FIG. 9) increases as the time to leave the pre-drying processing liquid increases. Thus, the number of times to repeat the precipitation and dissolution may be set in accordance with the allowed time.

When the solid 121 of the sublimable substance is precipitated, the vapor pressure of the solvent in the atmosphere that is in contact with the pre-drying processing liquid on the substrate W is maintained lower than the saturated vapor pressure of the solvent at the temperature of the atmosphere. When the solid 121 of the sublimable substance is dissolved, the temperature of the interface between the solid 121 of the sublimable substance and the pre-drying processing liquid is maintained at a value that exceeds the freeze point of the pre-drying processing liquid at the concentration of the sublimable substance when the solid 121 of the sublimable substance is dissolved. By doing so, the precipitation and dissolution of the solid 121 of the sublimable substance are naturally repeated.

When the solid 121 of the sublimable substance is precipitated and dissolved, the controller 3 may cause at least one of the central nozzle 55 and the upper central opening 61 of the shielding member 51 to discharge gas such as nitrogen gas at a low flow rate. In this case, the vaper of the solvent is immediately removed from above the substrate W and the vaporization of the solvent is urged. Furthermore, it is possible to minimize the change in the temperature of the interface of the solid 121 of the sublimable substance and the pre-drying processing liquid by discharging gas at a low flow rate toward the upper surface of the substrate W. Thus, the vaporization of the solvent is urged without preventing the dissolution of the solid 121 of the sublimable substance.

The FFU 6 supplies clean air all the time into the chamber 4. The downflow of clean air flowing toward the upper surface of the substrate W is blocked by the shielding member 51. Thus, the atmosphere on the substrate W is prevented from being disturbed. When the solid 121 of the sublimable substance is precipitated and dissolved, the controller 3 may cause the FFU 6 to temporarily stop the supply of the clean air. When the solid 121 of the sublimable substance is precipitated and dissolved, the controller 3 may cause the spin motor 14 to temporarily stop the rotation of the substrate W in order to prevent the atmosphere on the substrate W from being disturbed.

After the solid 121 of the sublimable substance is dissolved in the pre-drying processing liquid, a final precipitation step (step S11 in FIG. 9) is performed to precipitate the solid 121 of the sublimable substance again.

Specifically, with the shielding member 51 located at the lower position and at least one guard 24 located at the upper position, the spin motor 14 maintains the rotational speed of the substrate W at a final precipitation speed. The final precipitation speed may be equal to or different from the liquid supplying speed. The solvent evaporates from the surface of the pre-drying processing liquid while the substrate W rotates the final precipitation speed. When the concentration of the sublimable substance in the pre-drying processing liquid reaches the saturating concentration of the sublimable substance in the pre-drying processing liquid, the solid 121 of the sublimable substance precipitates at the upper surface of the substrate W, and all or almost all of the pre-drying processing liquid disappear from the substrate W (refer to FIG. 10E). Thereafter, a sublimating step (step S12 in FIG. 9) is performed to sublimate the solid 121 of the sublimable substance on the substrate W.

As described above, when the pre-drying processing liquid is the solution of camphor and methanol, the precipitation and dissolution of the solid 121 of the sublimable substance are repeated merely by leaving the pre-drying processing liquid on the upper surface of the substrate W. When a small amount of the pre-drying processing liquid remains on the substrate W, the solid 121 of the sublimable substance could dissolve in the pre-drying processing liquid before the solid 121 of the sublimable substance sublimates. To prevent it, the solid 121 of the sublimable substance on the substrate W may be cooled. For example, the rotational speed of the substrate W may be increased, or a flow rate of gas discharged toward the upper surface of the substrate W may be increased.

Figure 13:
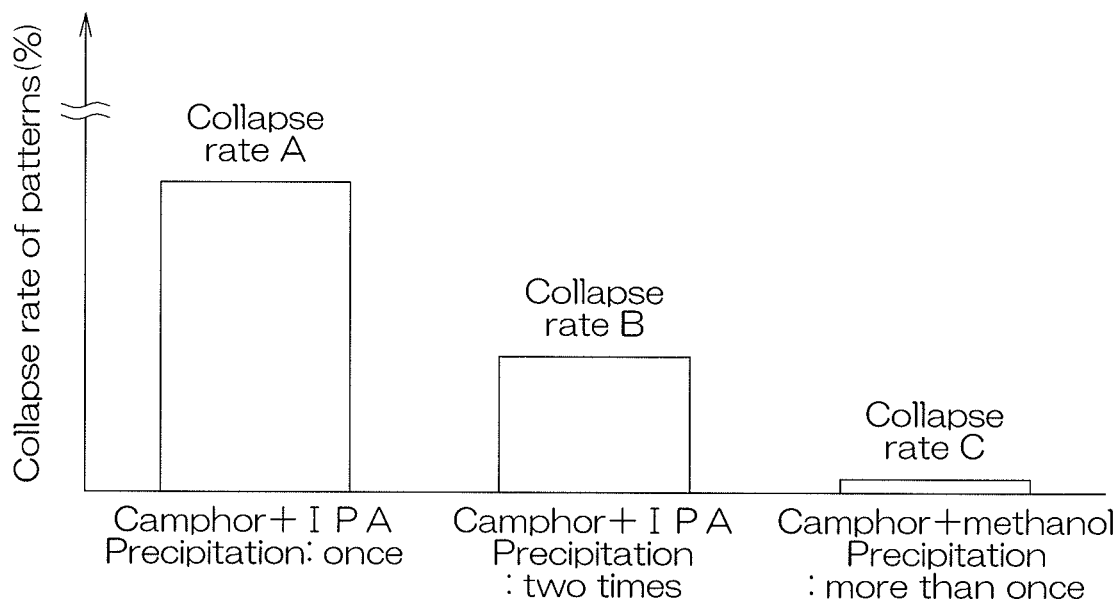
FIG. 13 is a graph showing collapse rates of patterns.

FIG. 13 is a graph showing collapse rates of the patterns PA. A collapse rate A and a collapse rate B are values where the pre-drying processing liquid is the solution of camphor and IPA, and the collapse rate C is a value where the pre-drying processing liquid is the solution of camphor and methanol.

The collapse rate A is a value where the solid 121 of the sublimable substance is precipitated once and thereafter the solid 121 of the sublimable substance is sublimated. The collapse rate B is a value where the solid 121 of the sublimable substance is precipitated twice and thereafter the solid 121 of the sublimable substance is sublimated. The collapse rate C is a value where the solid 121 of the sublimable substance is precipitated more than once and thereafter the solid 121 of the sublimable substance is sublimated. Conditions to process the substrate W in the collapse rate A to the collapse rate C are the same with the exception of the composition of the pre-drying processing liquid and the number of times to precipitate the solid 121 of the sublimable substance.

The collapse rate A is lower than a value where IPA drying is performed to dry the substrate W by removing IPA on the substrate W through the high-speed rotation of the substrate W. The collapse rate B is lower than the collapse rate A. Similarly, the collapse rate C is lower than the collapse rate A. The collapse rate C is lower than the collapse rate B. The collapse rate B is less than half of the collapse rate A. The collapse rate C is less than half of the collapse rate B. The collapse rate C is less than 1% and very low.

Since the collapse rate B is lower than the collapse rate A, it is possible to decrease the collapse rate of the patterns PA by precipitating again the solid 121 of the sublimable substance after the precipitated solid 121 of the sublimable substance is dissolved in the pre-drying processing liquid. Since the collapse rate C is lower than the collapse rate B, it is possible to further decrease the collapse rate of the patterns PA by using methanol as the solvent instead of IPA when the sublimable substance is camphor. Thus, it is possible to decrease the collapse rate of the patterns PA by performing the single repetitive cycle from the first precipitation step (step S8 in FIG. 9) to the first dissolving step (step S9 in FIG. 9) one or more times even when the strength of the pattern is very low.

According to the study and research conducted by the present inventors, in a case where the gap G1 between the patterns PA (refer to FIG. 10A) is 30 nm or less, the collapse rate of the patterns PA is not always good even when the sublimation drying is performed. It is conceivable that this is because the incomplete precipitation region in which no or almost no solid 121 of the sublimable substance exists between the patterns PA is formed in the upper surface of the substrate. Thus, it is possible to decrease the collapse rate of the patterns PA by precipitating again the solid 121 of the sublimable substance after the precipitated solid 121 of the sublimable substance is dissolved in the pre-drying processing liquid even when the gap G1 between the patterns PA formed on the substrate W to be processed is 30 nm or less.

Next, description will be made to a change of the film thickness of the pre-drying processing liquid.

Figure 14:
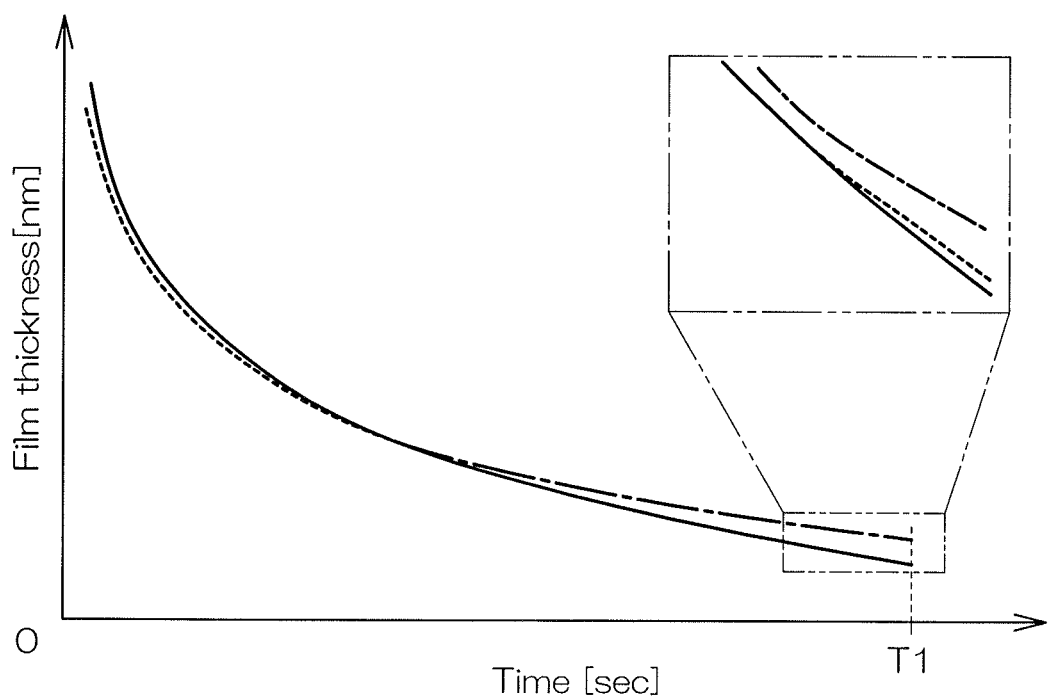
FIG. 14 is a graph showing temporal changes of the thickness of the liquid film of the pre-drying processing liquid on the upper surface of the substrate until the solid of the sublimable substance precipitates from the pre-drying processing liquid.

FIG. 14 is a graph showing temporal changes of the thickness of the liquid film of the pre-drying processing liquid on the upper surface of the substrate W until the solid 121 of the sublimable substance precipitates from the pre-drying processing liquid. The inset in FIG. 14 is different from other portions in FIG. 14 in the aspect ratio.

A plurality of curves in FIG. 14 (a solid curve, an alternate long and short dashed curve and a dashed curve) are film thickness curves indicating measured values obtained when a plurality of pre-drying processing liquids in which the concentrations of the sublimable substance are different from each other are used. Measuring conditions are the same with the exception of the concentration of the sublimable substance. As shown in FIG. 14, regardless of the concentration of the sublimable substance, the film thickness of the pre-drying processing liquid decreases as time passes when the solid 121 of the sublimable substance precipitates from the pre-drying processing liquid.

In FIG. 14, the liquid film of the pre-drying processing liquid is only measured up to time T1. This is because the solid 121 of the sublimable substance precipitates at time T1. That is, the pre-drying processing liquid is transparent, whereas the transparency of the solid 121 of the sublimable substance is lower than that of the pre-drying processing liquid. For this reason, when the solid 121 of the sublimable substance precipitates, the detected value of the film thickness measuring unit 91 changes drastically, so that the liquid film of the pre-drying processing liquid is unable to be measured.

When the solid 121 of the sublimable substance precipitates, the detected value of the film thickness measuring unit 91 changes drastically, so that the controller 3 is able to determine whether the solid 121 of the sublimable substance precipitates by monitoring detected values of the film thickness measuring unit 91. Furthermore, the film thickness of the pre-drying processing liquid immediately before the solid 121 of the sublimable substance precipitates is substantially equal to the thickness of the solid 121 of the sublimable substance immediately after the solid 121 of the sublimable substance precipitates. Thus, the controller 3 is able to measure the thickness of the solid 121 of the sublimable substance by measuring the film thickness of the pre-drying processing liquid.

As shown in FIG. 14, regardless of the concentration of the sublimable substance, the film thickness of the pre-drying processing liquid decreases rapidly and thereafter decreases gradually. During a period in which the film thickness of the pre-drying processing liquid decreases rapidly, there is almost no difference in the film thickness of the pre-drying processing liquid and in a decreasing speed of the film thickness among the plurality of pre-drying processing liquids in which the concentrations of the sublimable substance are different from each other. That is, if the elapsed time is the same, regardless of the concentration of the sublimable substance, the film thicknesses of the pre-drying processing liquid decrease at almost the same decreasing speed.

In contrast, as shown in the inset of FIG. 14, during a period in which the film thickness of the pre-drying processing liquid decreases gradually, there are differences in the decreasing speed of the film thickness among the plurality of pre-drying processing liquids in which the concentrations of the sublimable substance are different from each other. It is conceivable that this is because the viscosity of the pre-drying processing liquid changes when the concentration of the sublimable substance changes. Thus, it is possible to estimate the actual concentration of the sublimable substance in the pre-drying processing liquid on the substrate W by monitoring the liquid film of the pre-drying processing liquid on the substrate W after measuring and recording the decreasing speed of the film thickness among the plurality of pre-drying processing liquids in which the concentrations of the sublimable substance are different from each other.

If the film thickness of the pre-drying processing liquid before the solid 121 of the sublimable substance precipitates is the same, the thickness of the solid 121 of the sublimable substance increases as the concentration of the sublimable substance increases, and the thickness of the solid 121 of the sublimable substance decreases as the concentration of the sublimable substance decreases. Thus, it is possible to estimate the thickness of the solid 121 of the sublimable substance before the solid 121 of the sublimable substance actually precipitates by measuring the film thickness of the pre-drying processing liquid and estimating the actual concentration of the sublimable substance.

Figure 15:
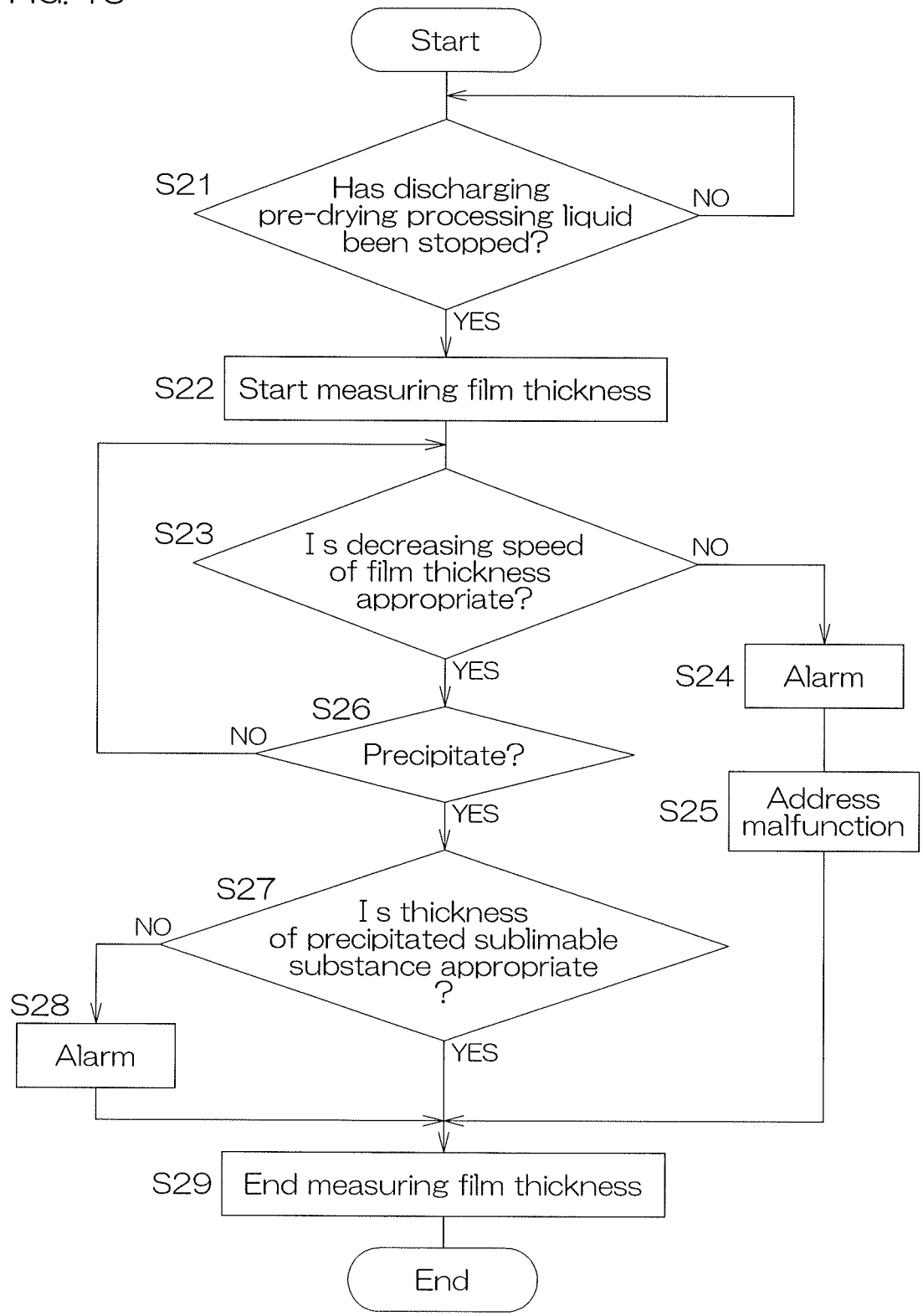
FIG. 15 is a flow chart showing the flow from the start of the measurement of the film thickness of the pre-drying processing liquid to the precipitation of the solid of the sublimable substance.

FIG. 15 is a flow chart showing the flow from the start of the measurement of the film thickness of the pre-drying processing liquid to the precipitation of the solid 121 of the sublimable substance. Hereinafter, FIG. 2, FIG. 7 and FIG. 15 shall be referenced.

It is noted that in a case where the pre-drying processing liquid is the solution of camphor and IPA, the film thickness of the pre-drying processing liquid may be measured each time the solid 121 of the sublimable substance is precipitated, or may be measured only when the solid 121 of the sublimable substance is first precipitated. That is, the film thickness of the pre-drying processing liquid may be measured in parallel with at least of the first precipitation step (step S8 in FIG. 9) and the final precipitation step (step S11 in FIG. 9). In a case where the pre-drying processing liquid is the solution of camphor and methanol, the film thickness of the pre-drying processing liquid may be measured only when the solid 121 of the sublimable substance is first precipitated.

When the measuring of the film thickness of the pre-drying processing liquid starts, the controller 3 determines whether the discharge of the pre-drying processing liquid is stopped based on whether the pre-drying processing liquid valve 41 is open (step 21 in FIG. 15). If the pre-drying processing liquid nozzle 39 is discharging the pre-drying processing liquid (No in step S21 in FIG. 15), the controller 3 determines again whether the discharge of the pre-drying processing liquid is stopped after a predetermined time has elapsed (step 21 in FIG. 15). If the discharge of the pre-drying processing liquid has been stopped (Yes in step S21 in FIG. 15), the controller 3 causes the film thickness measuring unit 91 to start measuring the film thickness of the pre-drying processing liquid (step 22 in FIG. 15).

During a period in which the film thickness measuring unit 91 is measuring the film thickness of the pre-drying processing liquid, the controller 3 monitors the decreasing speed of the film thickness of the pre-drying processing liquid based on the film thickness of the pre-drying processing liquid. As described above, the decreasing speed of the film thickness relates to the actual concentration of the sublimable substance in the pre-drying processing liquid on the substrate W. A reference speed range representing a range of the decreasing speed of the film thickness is specified in the recipe. The controller 3 determines whether the decreasing speed of the film thickness is appropriate, that is, whether the decreasing speed of the film thickness is more than the lower limit of the reference speed range and less than the upper limit of the reference speed range (step 23 in FIG. 15).

In a case where the concentration of the sublimable substance is out of a reference concentration range and the decreasing speed of the film thickness is higher than or equal to the upper limit of the reference speed range or lower than or equal to the lower limit of the reference speed range for some reason such as malfunction of the first flow rate adjusting valve 107A or the second flow rate adjusting valve 107B (No in step S23 in FIG. 15), the controller 3 causes the alarm device 100C (refer to FIG. 8) to generate an alarm (step 24 in FIG. 15). Thereafter, the controller 3 performs a malfunction addressing step before the solid 121 of the sublimable substance precipitates (step 25 in FIG. 15). The malfunction addressing step will be described in detail below. The controller 3 causes the film thickness measuring unit 91 to stop measuring the film thickness of the pre-drying processing liquid (step 29 in FIG. 15).

If the decreasing speed of the film thickness is appropriate, that is, the decreasing speed of the film thickness is more than the lower limit of the reference speed range and less than the upper limit of the reference speed range (Yes in step S23 in FIG. 15), the controller 3 determines based on detected values of the film thickness measuring unit 91 whether the solid 121 of the sublimable substance is precipitated in the first precipitation step (step S8 in FIG. 9) in which the solid 121 of the sublimable substance is first precipitated (step 26 in FIG. 15). If the solid 121 of the sublimable substance is not precipitated (No in step S26 in FIG. 15), the controller 3 determines again whether the decreasing speed of the film thickness is appropriate after a predetermined time has elapsed (step 23 in FIG. 15).

If the solid 121 of the sublimable substance has been precipitated (Yes in step S26 in FIG. 15), the controller 3 determines whether the thickness of the solid 121 of the sublimable substance is appropriate, that is, the thickness of the solid 121 of the sublimable substance is more than the lower limit of a reference thickness range and less than the upper limit of the reference thickness range, based on detected values of the film thickness measuring unit 91 immediately before the solid 121 of the sublimable substance is precipitated (step 27 in FIG. 15).

If the thickness of the solid 121 of the sublimable substance is appropriate (Yes in step S27 in FIG. 15), the controller 3 causes the film thickness measuring unit 91 to stop measuring the film thickness of the pre-drying processing liquid (step 29 in FIG. 15). If the thickness of the solid 121 of the sublimable substance is not appropriate (No in step S27 in FIG. 15), the controller 3 causes the alarm device 100C (refer to FIG. 8) to generate an alarm (step 28 in FIG. 15), and thereafter causes the film thickness measuring unit 91 to stop measuring the film thickness of the pre-drying processing liquid (step 29 in FIG. 15).

Figure 16A:
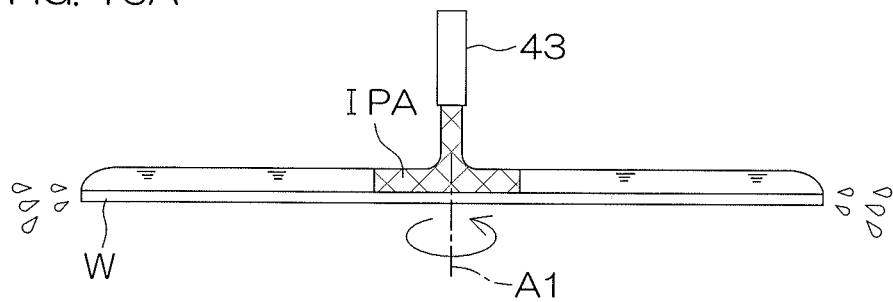
FIG. 16A is a schematic view for describing an example of a malfunction addressing step.
Figure 16B:
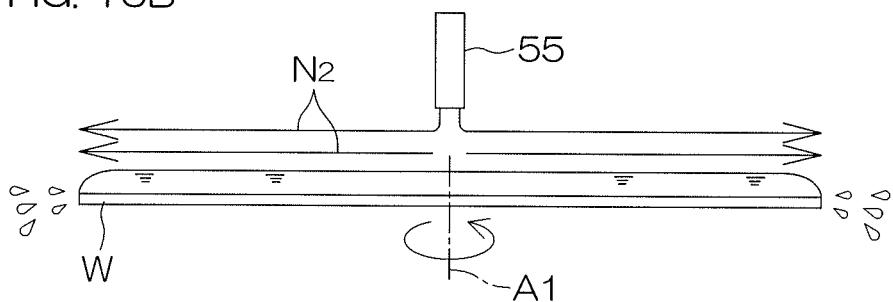
FIG. 16B is a schematic view for describing another example of the malfunction addressing step.
Figure 16C:
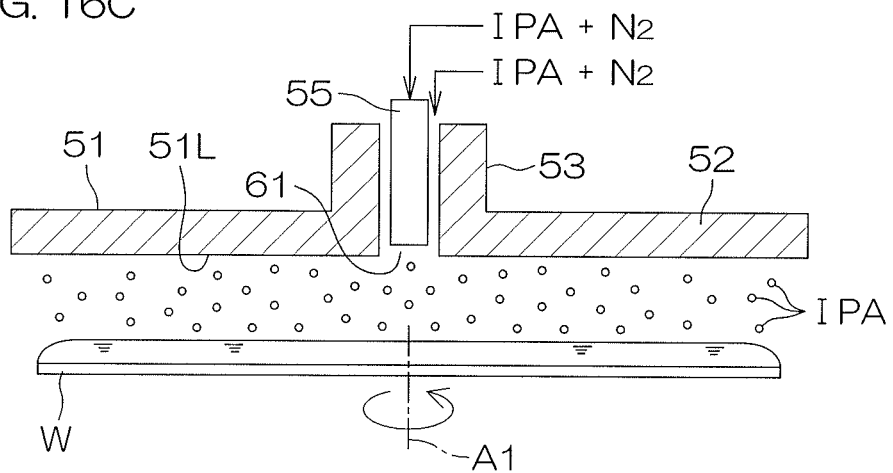
FIG. 16C is a schematic view for describing still another example of the malfunction addressing step.

FIG. 16A is a schematic view for describing an example of a malfunction addressing step. FIG. 16B is a schematic view for describing another example of the malfunction addressing step. FIG. 16C is a schematic view for describing still another example of the malfunction addressing step.

As described above, the controller 3 monitors the decreasing speed of the film thickness of the pre-drying processing liquid so as to determine whether the actual concentration of the sublimable substance contained in the pre-drying processing liquid on the substrate W is appropriate (step 23 in FIG. 15). This is because when a malfunction occurs in the actual concentration of the sublimable substance, the thickness of the solid 121 of the sublimable substance precipitated in the final precipitation step (step S11 in FIG. 9) becomes greater or smaller than the intended value. If the thickness of the solid 121 of the sublimable substance immediately before it is sublimated is greater or smaller than the intended value, the collapse rate of the patterns PA could deteriorate.

If the malfunction in the actual concentration of the sublimable substance is not caused by the failure of the first flow rate adjusting valve 107A (refer to FIG. 7) or the second flow rate adjusting valve 107B (refer to FIG. 7), the controller 3 may change the opening degree of at least one of the first flow rate adjusting valve 107A and the second flow rate adjusting valve 107B before the solid 121 of the sublimable substance precipitates.

For example, in a case where the actual concentration of the sublimable substance is assumed to greater than or equal to the upper limit of the reference concentration range, the controller 3 may change the opening degree of at least one of the first flow rate adjusting valve 107A and the second flow rate adjusting valve 107B so that the concentration of the sublimable substance in the pre-drying processing liquid becomes lower than or equal to the lower limit of the reference concentration range. In a case where the actual concentration of the sublimable substance is assumed to lower than or equal to the lower limit of the reference concentration range, the controller 3 may change the opening degree of at least one of the first flow rate adjusting valve 107A and the second flow rate adjusting valve 107B so that the concentration of the sublimable substance in the pre-drying processing liquid becomes greater than or equal to the upper limit of the reference concentration range.

If the malfunction in the actual concentration of the sublimable substance is caused by the failure of at least one of the first flow rate adjusting valve 107A and the second flow rate adjusting valve 107B, the controller 3 may perform any of the malfunction addressing steps (step 25 in FIG. 15) shown in FIG. 16A, FIG. 16B, and FIG. 16C.

FIG. 16A shows a state where the replacing liquid nozzle 43 discharges the solvent corresponding to the replacing liquid toward the upper surface of the substrate W. FIG. 16A shows an example in which the pre-drying processing liquid is the solution of camphor and IPA and the solvent is IPA. In a case where the pre-drying processing liquid is the solution of camphor and methanol, the replacing liquid nozzle 43 discharges methanol instead of IPA.

As shown in FIG. 16A, in a case where there is a malfunction in the actual concentration of the sublimable substance, the controller 3 may cause the replacing liquid nozzle 43 to discharge the solvent. In this case, the pre-drying processing liquid on the substrate W is replaced with the solvent, and the liquid film of the solvent covering the entire upper surface of the substrate W is formed. Thus, it is possible to remove the pre-drying processing liquid, the concentration of the sublimable substance in which is not appropriate, from the substrate W before the solid 121 of the sublimable substance precipitates. After the pre-drying processing liquid on the substrate W is replaced with the solvent, the pre-drying processing liquid, the concentration of the sublimable substance in which is appropriate, may be supplied to the substrate W.

FIG. 16B shows a state where the film thickness of the pre-drying processing liquid on the substrate W is decreasing. The film thickness may be decreased by increasing the rotational speed of the substrate W, by discharging gas such as nitrogen gas toward the upper surface of the substrate W, or by doing both of these.

In a case where the rotational speed of the substrate W increases, the controller 3 increases the rotational speed of the spin motor 14 (refer to FIG. 2). In a case where gas is discharged toward the upper surface of the substrate W, the controller 3 causes at least one of the central nozzle 55 and the upper central opening 61 of the shielding member 51 (refer to FIG. 2) to discharge nitrogen gas, for example. In a case where at least one of the central nozzle 55 and the upper central opening 61 of the shielding member 51 has already started discharging nitrogen gas, the controller 3 may increase the opening degree of at least one of the flow rate adjusting valve 58 (refer to FIG. 2) and the flow rate adjusting valve 65 (refer to FIG. 2).

In a case where the actual concentration of the sublimable substance is greater than or equal to the upper limit of the reference concentration range, the thickness of the solid 121 of the sublimable substance immediately before it is sublimated becomes greater than the intended value. When the film thickness of the pre-drying processing liquid on the substrate W is decreased, the amount of the sublimable substance contained in the pre-drying processing liquid on the substrate W decreases, so that the thickness of the solid 121 of the sublimable substance decreases.

Thus, in a case where the actual concentration of the sublimable substance is greater than or equal to the upper limit of the reference concentration range, the controller may decrease the film thickness of the pre-drying processing liquid on the substrate W before the solid 121 of the sublimable substance is precipitated. By doing so, the solid 121 of the sublimable substance having the intended thickness is precipitated even when there is a malfunction in the actual concentration of the sublimable substance.

FIG. 16C shows a state where mist or vapor of the solvent is discharged toward the upper surface of the substrate W. FIG. 16C shows an example in which the pre-drying processing liquid is the solution of camphor and IPA, and a space between the upper surface of the substrate W and the lower surface 51L of the shielding member 51 is filled with nitrogen gas including mist or vapor of IPA. In a case where the pre-drying processing liquid is the solution of camphor and methanol, nitrogen gas including mist or vapor of methanol is discharged toward the upper surface of the substrate W. The nitrogen gas corresponds to carrier gas that carries mist or vapor of the solvent toward the substrate W.

In a case where nitrogen gas including mist or vapor of IPA is discharged toward the upper surface of the substrate W, nitrogen gas may be supplied to IPA (liquid) in a tank (so-called bubbling). By doing so, multiple bubbles of nitrogen gas are formed in IPA, and nitrogen gas including mist or vapor of IPA is released from the surface of IPA in the tank. This nitrogen gas may be discharged from at least one the central nozzle 55 and the upper central opening 61 of the shielding member 51.

When the mist or vapor of the solvent is discharged toward the upper surface of the substrate W, the vapor pressure of the solvent in the atmosphere that is in contact with the pre-drying processing liquid on the substrate W increases. Thus, the solvent is inhibited from vaporizing from the pre-drying processing liquid. Meanwhile, the vapor pressure of the sublimable substance in the atmosphere does not change, so that the sublimable substance evaporates from the pre-drying processing liquid although by a small amount. Thus, when the actual concentration of the sublimable substance is assumed to equal to the upper limit of the reference concentration range or slightly greater than the upper limit, it is possible to precipitate the solid 121 of the sublimable substance having the intended thickness by discharging mist or vapor of the solvent toward the upper surface of the substrate W even when there is a malfunction in the actual concentration of the sublimable substance.

Figure 17:
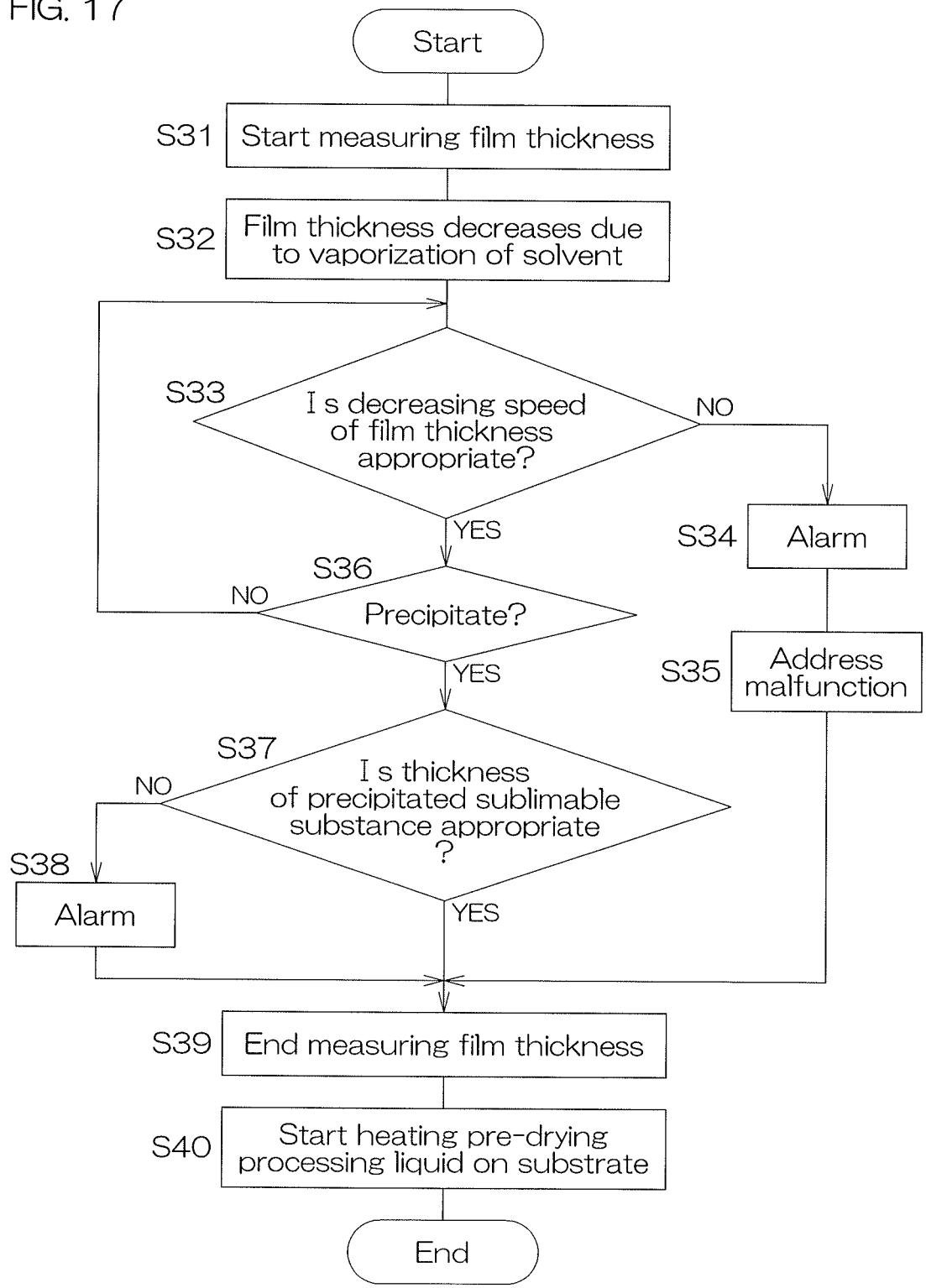
FIG. 17 is a flow chart showing the detailed flow from the start of the first precipitation step to the start of the first dissolving step when the pre-drying processing liquid is the solution of camphor and IPA.

FIG. 17 is a flow chart showing the detailed flow from the start of the first precipitation step (step S8 in FIG. 9) to the start of the first dissolving step (step S9 in FIG. 9) when the pre-drying processing liquid is the solution of camphor and IPA. Hereinafter, FIG. 2, FIG. 7 and FIG. 17 shall be referenced.

After the film thickness of the pre-drying processing liquid is decreased in the film thickness decreasing step (step S7 in FIG. 9), the controller 3 causes the film thickness measuring unit 91 to start measuring the film thickness of the pre-drying processing liquid (step S31 in FIG. 17). Furthermore, with the shielding member 51 located at the lower position and at least one guard 24 located at the upper position, the spin motor 14 maintains the rotational speed of the substrate W at the first precipitation speed. The solvent is evaporated from the surface of the pre-drying processing liquid while the substrate W is rotating at the first precipitation speed. Thus, the film thickness of the pre-drying processing liquid on the substrate W gradually decreases (step S32 in FIG. 17), and the concentration of the sublimable substance in the pre-drying processing liquid increases.

A reference speed range representing a range of the decreasing speed of the film thickness is specified in the recipe. While the film thickness measuring unit 91 is measuring the film thickness of the pre-drying processing liquid, the controller 3 determines whether the decreasing speed of the film thickness is appropriate, that is, whether the decreasing speed of the film thickness is higher than the lower limit of the reference speed range and less than the upper limit of the reference speed range based on detected values of the film thickness measuring unit 91 (step S33 in FIG. 17).

If the decreasing speed of the film thickness is not appropriate, that is, the decreasing speed of the film thickness is higher than or equal to the upper limit of the reference speed range or lower than or equal to the lower limit of the reference speed range (No in step S33 in FIG. 17), the controller 3 causes the alarm device 100C to generate an alarm (step S34 in FIG. 17). Thereafter, the controller 3 performs the above-described malfunction addressing step (step S35 in FIG. 17). The controller 3 causes the film thickness measuring unit 91 to stop measuring the film thickness of the pre-drying processing liquid (step S39 in FIG. 17).

If the decreasing speed of the film thickness is appropriate (Yes in step S33 in FIG. 17), the controller 3 determines based on detected values of the film thickness measuring unit 91 whether the solid 121 of the sublimable substance is precipitated (step S36 in FIG. 17). If the solid 121 of the sublimable substance is not precipitated (No in step S36 in FIG. 1), the controller 3 determines again whether the decreasing speed of the film thickness is appropriate after a predetermined time has elapsed (step S33 in FIG. 17).

If the solid 121 of the sublimable substance has been precipitated (Yes in step S36 in FIG. 17), the controller 3 determines whether the thickness of the solid 121 of the sublimable substance is appropriate, that is, the thickness of the solid 121 of the sublimable substance is more than the lower limit of a reference thickness range and less than the upper limit of the reference thickness range, based on detected values of the film thickness measuring unit 91 immediately before the solid 121 of the sublimable substance is precipitated (step S37 in FIG. 17).

If the thickness of the solid 121 of the sublimable substance is not appropriate (No in step S37 in FIG. 17), the controller 3 causes the alarm device 100C to generate an alarm (step S38 in FIG. 17), and causes the film thickness measuring unit 91 to stop measuring the film thickness of the pre-drying processing liquid (step S39 in FIG. 17). If the thickness of the solid 121 of the sublimable substance is appropriate (Yes in step S37 in FIG. 17), the controller 3 causes the film thickness measuring unit 91 to stop measuring the film thickness of the pre-drying processing liquid (step S39 in FIG. 17).

After it is confirmed that the solid 121 of the sublimable substance is precipitated, the controller 3 causes the lower-surface nozzle 71 to discharge the hot water to perform the first dissolving step (step S9 in FIG. 9) to dissolve the solid 121 of the sublimable substance in the pre-drying processing liquid on the substrate W. Thus, confirming the precipitation of the solid 121 of the sublimable substance triggers heating the pre-drying processing liquid, and the pre-drying processing liquid on the substrate W is heated (step S40 in FIG. 17).

In a case where the time from the precipitation of the solid 121 of the sublimable substance to the sublimation of the solid 121 of the sublimable substance is short, all or a portion of the solid 121 of the sublimable substance may sublimate before the solid 121 of the sublimable substance is dissolved in the pre-drying processing liquid, that is, before heating the pre-drying processing liquid starts. Even in this case, it is possible to start heating the pre-drying processing liquid at the optimal time and reduce the solid 121 of the sublimable substance that sublimates unintentionally by monitoring whether the solid 121 of the sublimable substance precipitates.

As described above, in the preferred embodiment, the solution including the sublimable substance and the solvent and corresponding to the pre-drying processing liquid is supplied to the upper surface of the substrate W. Thus, the liquid film of the pre-drying processing liquid is formed on the upper surface of the substrate W. Thereafter, the solvent is evaporated from the pre-drying processing liquid. The concentration of the sublimable substance in the pre-drying processing liquid increases in accordance with the vaporization of the solvent. When the concentration of the sublimable substance reaches the saturating concentration of the sublimable substance, the solid 121 of the sublimable substance precipitates in the pre-drying processing liquid.

When the precipitation of the solid 121 of the sublimable substance has started, the pre-drying processing liquid remains on the upper surface of the substrate W. At least a portion of the solid 121 of the sublimable substance is dissolved in the remaining pre-drying processing liquid.

Thereafter, the solvent is evaporated from the pre-drying processing liquid again. Thus, the contained amount of the solvent decreases, and then the solid 121 of the sublimable substance precipitates onto the upper surface of the substrate W. Thereafter, the solid 121 of the sublimable substance is sublimated and removed from the substrate W. In this way, the pre-drying processing liquid is removed from the substrate W and the substrate W is dried.

Before the solid 121 of the sublimable substance is precipitated first, the pre-drying processing liquid exists not only between the patterns PA but also above the patterns PA. For the substrate W such as a semiconductor wafer or a glass substrate W for FPD, the gap G1 between the patterns PA is narrow. In a case where the gap G1 between the patterns PA is narrow, the pre-drying processing liquid between the patterns PA may have a property different from that of a bulk of the pre-drying processing liquid, that is, the pre-drying processing liquid existing in a range from the surface (upper surface) of the pre-drying processing liquid to the upper surfaces of the patterns PA. The differences in properties between the two become large as the gap G1 between the patterns PA decrease.

If the gap G1 between the patterns PA is narrow, when the solid 121 of the sublimable substance precipitates first, there is a case where the solid 121 of the sublimable substance precipitates only in the bulk of the pre-drying processing liquid and an incomplete precipitation region in which no or almost no solid 121 of the sublimable substance exists between the patterns PA is formed in the upper surface of the substrate W. In this case, the surface tension of the pre-drying processing liquid between the patterns PA applies to the side surfaces of the patterns PA, so that the patterns PA in the incomplete precipitation region could collapse while the solid 121 of the sublimable substance sublimates. This causes an increase (worsening) in the collapse rate of the patterns PA.

In contrast, it has been found that crystal cores of the solid 121 of the sublimable substance are formed in a narrow space such as a space between the patterns PA when the precipitated solid 121 of the sublimable substance is dissolved in the pre-drying processing liquid and then the solid 121 of the sublimable substance is precipitated again. Thus, if the gap G1 between the patterns PA is narrow, it is possible to prevent the incomplete precipitation region from generating or to reduce the area of the incomplete precipitation region by dissolving the precipitated solid 121 of the sublimable substance into the pre-drying processing liquid and thereafter precipitating the solid 121 of the sublimable substance again. Accordingly, it is possible to decrease the collapse of the pattern PA and the collapse rate of the patterns PA.

In the preferred embodiment, the solvent is evaporated from the pre-drying processing liquid while keeping the pre-drying processing liquid on the substrate W at or below the room temperature without heating the pre-drying processing liquid. In this case, the concentration of the sublimable substance locally increases at the surface of the pre-drying processing liquid and the solid 121 of the sublimable substance precipitates at the surface of the pre-drying processing liquid or its vicinity. At the same time, the pre-drying processing liquid remains between the solid 121 of the sublimable substance and the upper surface of the pattern PA. The solid 121 of the sublimable substance dissolves in the remaining pre-drying processing liquid.

In contrast, when the solvent is evaporated from the pre-drying processing liquid by heating the pre-drying processing liquid, the temperature of the pre-drying processing liquid rises to a value higher than the room temperature and the concentration of the sublimable substance in the pre-drying processing liquid also rises. When the solid 121 of the sublimable substance is precipitated by natural cooling or forced cooling of the pre-drying processing liquid after the concentration of the sublimable substance rises, there is a case where the most portion or the entirety of the bulk of the pre-drying processing liquid changes to the solid 121 of the sublimable substance.

When the pre-drying processing liquid does not exist above the patterns PA, the solid 121 of the sublimable substance does not effectively dissolve in the pre-drying processing liquid. Even when the pre-drying processing liquid exists between the patterns PA, the efficiency of dissolving the solid 121 of the sublimable substance into the pre-drying processing liquid existing between the patterns PA is inferior to the efficiency of dissolving the solid 121 of the sublimable substance into the bulk of the pre-drying processing liquid. Thus, it is possible to effectively dissolve the solid 121 of the sublimable substance into the pre-drying processing liquid by maintaining some of the bulk of the pre-drying processing liquid in liquid.

In the preferred embodiment, the pre-drying processing liquid on the upper surface of the substrate W is heated and the temperature of the pre-drying processing liquid rises to a value higher than the room temperature. The dissolution of the solid 121 of the sublimable substance in the pre-drying processing liquid is urged by increasing the temperature of the pre-drying processing liquid. Thus, it is possible to effectively dissolve the solid 121 of the sublimable substance into the pre-drying processing liquid. Furthermore, a forced dissolution of the solid 121 of the sublimable substance is started in accordance with the start of heating, so that it is possible to start the forced dissolution of the solid 121 of the sublimable substance at any time by changing the timing to start of heating.

In the preferred embodiment, the solid 121 of the sublimable substance and the pre-drying processing liquid are not directly heated from above the substrate W, but are indirectly heated via the substrate W. When the solid 121 of the sublimable substance and the pre-drying processing liquid are heated from above the substrate W, a portion of the solid 121 of the sublimable substance existing on the surface of the pre-drying processing liquid may sublimate. In this case, a portion of the solid 121 of the sublimable substance is wasted and the final thickness of the solid 121 of the sublimable substance is smaller than the intended value. It is possible to reduce such a loss of the sublimable substance by heating the solid 121 of the sublimable substance and the pre-drying processing liquid via the substrate W.

In the preferred embodiment, the solvent is evaporated from the pre-drying processing liquid while heating the pre-drying processing liquid so as to precipitate the solid 121 of the sublimable substance onto the substrate W. Thus, the solid 121 of the sublimable substance precipitates from the hot pre-drying processing liquid. The saturating concentration of the sublimable substance in the pre-drying processing liquid rises as the temperature of the pre-drying processing liquid rises. The proportion of the solvent included in the solid 121 of the sublimable substance decreases as the saturating concentration of the sublimable substance rises. When the solid 121 of the sublimable substance sublimates, the solvent included in the solid 121 of the sublimable substance could generate a collapsing force to collapse the pattern PA. Accordingly, it is possible to further decrease the collapse rate of the patterns PA by decreasing the contained amount of the solvent.

In the preferred embodiment, the solid 121 of the sublimable substance is precipitated onto the surface of the pre-drying processing liquid. When the solvent evaporates from the pre-drying processing liquid, the heat of the pre-drying processing liquid, which corresponds to the heat of vaporization, is released into the atmosphere together with the solvent and the temperature of the surface of the pre-drying processing liquid decreases. When the solid 121 of the sublimable substance is formed, the solvent to evaporate from the pre-drying processing liquid decreases, so that the heat of the pre-drying processing liquid to be released into the atmosphere also decreases. At the same time, the heat in the atmosphere is transmitted to the pre-drying processing liquid via the solid 121 of the sublimable substance. Thus, temperature of the interface between the solid 121 of the sublimable substance and the pre-drying processing liquid increases. Accordingly, it is possible to dissolve the solid 121 of the sublimable substance into the pre-drying processing liquid without forcibly heating the pre-drying processing liquid on the substrate W.

Other Preferred Embodiments

The present invention is not restricted to the contents of the above described preferred embodiments and various modifications are possible.

For example, in the first precipitation step (step S8 in FIG. 9) to precipitate the solid 121 of the sublimable substance first, the solvent may be evaporated from the pre-drying processing liquid on the substrate W while heating the pre-drying processing liquid on the substrate W at the heating temperature higher than the room temperature, instead of keeping the temperature of the pre-drying processing liquid on the substrate W lower than or equal to the room temperature.

In the final precipitation step (step S11 in FIG. 9) of the first processing example, the solvent may be evaporated from the pre-drying processing liquid while stopping the forcibly heating of the pre-drying processing liquid on the substrate W, instead of heating the pre-drying processing liquid on the substrate W so as to evaporate the solvent.

When the solid 121 of the sublimable substance is dissolved in the pre-drying processing liquid, heating gas the temperature of which is higher than the room temperature may be discharged toward the upper surface of the substrate W or the lower surface of the substrate W, instead of supplying the lower surface of the substrate W with the hot water, which is an example of heating liquid the temperature of which is higher than the room temperature. For example, nitrogen gas the temperature of which is higher than the room temperature may be discharged from at least one of the central nozzle 55 and the lower central opening 81 of the spin base 12. A heating element that produces Joule heat due to the flow of electricity or a lamp that emits light toward the substrate W may be disposed above and/or below the substrate W. For example, the heating element may be disposed inside at least one of the spin base 12 and the shielding member 51.

The solid 121 of the sublimable substance may be removed at the processing unit 2 different from the wet-processing unit 2W. The processing unit 2 to remove the solid 121 of the sublimable substance may be a portion of the substrate processing apparatus 1, or may be a portion of a substrate processing apparatus 1 different from the substrate processing apparatus 1. That is, a single substrate processing system may include the substrate processing apparatus 1 including the wet-processing unit 2W and a substrate processing apparatus 1 including a processing unit 2 to remove the solid 121 of the sublimable substance, and the substrate W may be transferred from the substrate processing apparatus 1 to another substrate processing apparatus 1 before the solid 121 of the sublimable substance is removed.

When the rinse liquid such as pure water on the substrate W can be replaced with the pre-drying processing liquid, the pre-drying processing liquid supplying step may be performed without performing the replacement liquid supplying step to replace the rinse liquid on the substrate W with the replacement liquid.

The shielding member 51 may include a cylindrical portion that extends downwardly from the outer circumferential portion of the disc portion 52 in addition to the disc portion 52. In the case, when the shielding member 51 is disposed at the lower position, the substrate W held on the spin chuck 10 is surrounded by the cylindrical portion.

The shielding member 51 may rotate around the rotation axis A1 together with the spin chuck 10. For example, the shielding member 51 may be placed on the spin base 12 so as not to contact the substrate W. In the case, since the shielding member 51 is coupled to the spin base 12, the shielding member 51 rotates at the same speed in the same direction as that of the spin base 12.

The shielding member 51 may be eliminated. However, when a liquid such as pure water is supplied to the lower surface of the substrate W, the shielding member 51 is preferably provided. This is because the shielding member 51 can interrupt droplets flowing from the lower surface of the substrate W toward the upper surface of the substrate W through the outer circumferential surface of the substrate W, or droplets that have bounced inwardly from the processing cup 21, thus reducing a liquid that would be otherwise mixed into the pre-drying processing liquid on the substrate W.

If it is not necessary to change the incident position of the light of the light emitting device 92 with respect to the upper surface of the substrate W, the electric motor 96 of the film thickness measuring unit 91 may be omitted.

In a case where the light of the light emitting device 92 substantially perpendicularly comes into contact with the upper surface of the substrate W, the housing 93 of the film thickness measuring unit 91 may house the photo detector 97 in addition to the light emitting device 92. In this case, the light of the light emitting device 92 reflected by the upper surface of the substrate W (the reflected light) passes through the opening of the housing 93 closed by the transparent plate 94 and is received by the photo detector 97 in the housing 93.

In a case where both of the light emitting device 92 and the photo detector 97 are housed in the housing 93, the controller 3 may move the incident position, at which the light of the light emitting device 92 comes into contact with the upper surface of the substrate W, in the radical direction of the substrate W by horizontally moving the housing 93. Specifically, the processing unit 2 may include a scan arm that holds the housing 93 above the substrate W held by the spin chuck 10 and an electric actuator that horizontally moves the scan arm with in the chamber 4.

Although the substrate processing apparatus 1 is disposed in a clean room and the temperature inside the substrate processing apparatus 1 is maintained at a value equal or substantially equal to the temperature inside the clean room, the temperature inside the substrate processing apparatus 1 may be different from the temperature inside the clean room. For example, the substrate processing apparatus 1 may include an air conditioner that adjusts the temperature inside the substrate processing apparatus 1.

In a case where the pre-drying processing liquid is the solution of camphor and methanol, if the temperature inside the substrate processing apparatus 1 (more specifically, the temperature inside the chamber 4) is higher than the temperature of the surface of the pre-drying processing liquid when the sublimable substance precipitates (hereinafter, "surface temperature at precipitation"), the temperature of the interface of the solid 121 of the sublimable substance and the pre-drying processing liquid increases and the solid 121 of the sublimable substance dissolves in the pre-drying processing liquid merely by leaving the pre-drying processing liquid on the upper surface of the substrate W. Thus, the precipitation and dissolution of the sublimable substance are spontaneously repeated.

In a case where the temperature inside the clean room is lower than the surface temperature at precipitation, the controller 3 may cause the air conditioner to adjust the temperature inside the substrate processing apparatus 1 so that the internal space of the chamber 4 is maintained at a temperature higher than the surface temperature at precipitation. Similarly, in a case where the air pressure inside the clean room is a value unsuitable for the precipitation and dissolution of the sublimable substance, the controller 3 may change at least one of the output of the FFU 6 (refer to FIG. 2) and the opening degree of the exhaust valve 9 (refer to FIG. 2). In this case, at least one of the flow rate of gas supplied to the interior of the chamber 4 and the flow rate of gas discharged from the chamber 4 changes, and the air pressure inside the chamber 4 is maintained at a value suitable for the precipitation and dissolution of the sublimable substance.

The substrate processing apparatus 1 may include at least one of a thermometer that measures the temperature inside the chamber 4 and a pressure gauge that measures the air pressure inside the chamber 4. In a case where at least one of the temperature and the air pressure inside the chamber 4 drastically changes while the substrate W is being processed by the processing unit 2, the controller 3 may stop carrying in the next substrate W into the chamber 4 until both of the temperature and the air pressure inside the chamber 4 are maintained at values suitable for the precipitation and dissolution of the sublimable substance.

The substrate processing apparatus 1 is not restricted to an apparatus for processing a disc-shaped substrate W, and may be an apparatus for processing a polygonal substrate W.

Two or more arrangements among all the arrangements described above may be combined. Two or more steps among all the steps described above may be combined.

The controller 3 is an example of a first precipitation unit, a first dissolving unit and a final precipitation unit. The pre-drying processing liquid nozzle 3 is an example of the pre-drying processing liquid supplying unit. The pre-drying processing liquid supplying unit 101 is an example of the pre-drying processing liquid supplying unit. The spin chuck 10 and the central nozzle 55 are an example of a sublimating unit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate drying method comprising:
    a pre-drying processing liquid supplying step of supplying an upper surface of a substrate, on which a pattern is formed, with a pre-drying processing liquid which is a solution including a sublimable substance corresponding to a solute and a solvent in which the sublimable substance dissolved, and forming a liquid film of the pre-drying processing liquid onto the upper surface of the substrate;
    a first precipitation step of precipitating a solid of the sublimable substance in the pre-drying processing liquid on the upper surface of the substrate by evaporating the solvent from the pre-drying processing liquid on the upper surface of the substrate;
    a first dissolving step of dissolving at least a portion of the solid of the sublimable substance in the pre-drying processing liquid on the upper surface of the substrate;
    a final precipitation step of precipitating the solid of the sublimable substance onto the upper surface of the substrate by evaporating the solvent from the pre-drying processing liquid in which the solid of the sublimable substance has been dissolved; and
    a sublimating step of removing the solid of the sublimable substance from the upper surface of the substrate by sublimating the solid of the sublimable substance.

2. The substrate drying method according to claim 1, wherein
    the first precipitation step includes a room temperature precipitation step of precipitating the solid of the sublimable substance onto the upper surface of the substrate by evaporating the solvent from the pre-drying processing liquid on the upper surface of the substrate while keeping a temperature of the pre-drying processing liquid on the upper surface of the substrate lower than or equal to a room temperature.

3. The substrate drying method according to claim 1, wherein
    the first dissolving step includes a heating step of heating the pre-drying processing liquid on the upper surface of the substrate at a heating temperature higher than a room temperature.

4. The substrate drying method according to claim 3, wherein
    the heating step includes an indirectly heating step of heating the pre-drying processing liquid on the upper surface of the substrate at the heating temperature by heating the substrate from below the substrate.

5. The substrate drying method according to claim 3, wherein
    the final precipitation step includes a step of precipitating the solid of the sublimable substance onto the upper surface of the substrate by evaporating the solvent from the pre-drying processing liquid on the upper surface of the substrate while heating the pre-drying processing liquid on the upper surface of the substrate at the heating temperature.

6. The substrate drying method according to claim 1, wherein
    the first precipitation step includes a liquid surface precipitation step of precipitating the solid of the sublimable substance onto a surface of the pre-drying processing liquid on the upper surface of the substrate by evaporating the solvent from the pre-drying processing liquid on the upper surface of the substrate,
    the first dissolving step includes a spontaneously dissolving step of allowing at least a portion of the solid of the sublimable substance to dissolve in or be dissolved in the pre-drying processing liquid on the upper surface of the substrate by allowing the temperature of the pre-drying processing liquid to increase or be increased due to heat of an atmosphere in contact with the solid of the sublimable substance.

7. A substrate processing apparatus comprising:

a pre-drying processing liquid supplying unit that supplies an upper surface of a substrate, on which a pattern is formed, with a pre-drying processing liquid which is a solution including a sublimable substance corresponding to a solute and a solvent in which the sublimable substance dissolved, and forms a liquid film of the pre-drying processing liquid onto the upper surface of the substrate;

a first precipitation unit that precipitates a solid of the sublimable substance in the pre-drying processing liquid on the upper surface of the substrate by evaporating the solvent from the pre-drying processing liquid on the upper surface of the substrate;

a first dissolving unit that dissolves at least a portion of the solid of the sublimable substance in the pre-drying processing liquid on the upper surface of the substrate;

a final precipitation unit that precipitates the solid of the sublimable substance onto the upper surface of the substrate by evaporating the solvent from the pre-drying processing liquid in which the solid of the sublimable substance has been dissolved; and a sublimating unit that removes the solid of the sublimable substance from the upper surface of the substrate by sublimating the solid of the sublimable substance.

\* \* \* \* \*